(12) United States Patent
Rieske et al.

(10) Patent No.: US 11,712,749 B2
(45) Date of Patent: Aug. 1, 2023

(54) PARENT SUBSTRATE, WAFER COMPOSITE AND METHODS OF MANUFACTURING CRYSTALLINE SUBSTRATES AND SEMICONDUCTOR DEVICES

(71) Applicant: Infineon Technologies AG, Neubiberg (DE)

(72) Inventors: Ralf Rieske, Dresden (DE); Alexander Binter, Villach (AT); Wolfgang Diewald, Villach (AT); Bernhard Goller, Villach (AT); Heimo Graf, Trebesing (AT); Gerald Lackner, Arnoldstein (AT); Jan Richter, Dresden (DE); Roland Rupp, Lauf (DE); Guenter Schagerl, Villach (AT); Marko Swoboda, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 150 days.

(21) Appl. No.: 16/986,411

(22) Filed: Aug. 6, 2020

(65) Prior Publication Data
US 2021/0053148 A1 Feb. 25, 2021

(30) Foreign Application Priority Data
Aug. 22, 2019 (DE) .......................... 102019122614.7

(51) Int. Cl.
| | |
|---|---|
| *B23K 26/0622* | (2014.01) |
| *H01L 21/02* | (2006.01) |
| *B23K 26/00* | (2014.01) |
| *H01L 21/78* | (2006.01) |

(52) U.S. Cl.
CPC ...... *B23K 26/0624* (2015.10); *B23K 26/0006* (2013.01); *H01L 21/02378* (2013.01); *H01L 21/7813* (2013.01)

(58) Field of Classification Search
None
See application file for complete search history.

(56) References Cited

U.S. PATENT DOCUMENTS

| | | | |
|---|---|---|---|
| 5,374,564 A * | 12/1994 | Bruel | G01L 9/0042 438/455 |
| 9,583,531 B2 * | 2/2017 | Broekaart | H01L 27/1464 |
| 2009/0203167 A1 * | 8/2009 | Mitani | H01L 21/76256 438/106 |
| 2013/0273721 A1 * | 10/2013 | Wang | F16L 21/035 438/478 |

(Continued)

FOREIGN PATENT DOCUMENTS

| | | |
|---|---|---|
| WO | 2016207276 A1 | 12/2016 |
| WO | 2016207277 A1 | 12/2016 |
| WO | 2018192691 A1 | 10/2018 |

*Primary Examiner* — Evren Seven
(74) *Attorney, Agent, or Firm* — Murphy, Bilak & Homiller, PLLC

(57) ABSTRACT

Provided is a parent substrate that includes a central region and an edge region. The edge region surrounds the central region. A detachment layer is formed in the central region. The detachment layer extends parallel to a main surface of the parent substrate. The detachment layer includes modified substrate material. A groove is formed in the edge region. The groove laterally encloses the central region. The groove runs vertically and/or tilted to the detachment layer.

26 Claims, 15 Drawing Sheets

(56) References Cited

U.S. PATENT DOCUMENTS

2014/0038392 A1\* 2/2014 Yonehara ............ H01L 31/0682
  438/463
2018/0290232 A1   10/2018 Richter et al.
2019/0363057 A1   11/2019 Santos Rodriguez et al.

\* cited by examiner

PARENT SUBSTRATE, WAFER COMPOSITE AND METHODS OF MANUFACTURING CRYSTALLINE SUBSTRATES AND SEMICONDUCTOR DEVICES

TECHNICAL FIELD

The present disclosure is related to a method of manufacturing a crystalline substrate, in particular a crystalline device substrate, to a method of manufacturing a semiconductor device, to a crystalline substrate, and to a wafer composite including a crystalline substrate.

BACKGROUND

Crystalline substrates like crystalline semiconductor substrates are typically available in standard sizes, wherein the standard defines diameter and thickness. On the other hand, attempts have been made to reduce the final thickness of thin semiconductor devices to improve device characteristics. For example, for power semiconductor devices with a vertical load current flow between a front side and a back side, a thinner semiconductor die may result in lower on-state resistance. Other attempts aim at reducing substrate costs by using thin semiconductor slices as base for epitaxial growth. For example, splitting methods horizontally split thin slices from semiconductor boules or horizontally split standard wafers (wafer twinning). Crystalline substrates like semiconductor wafers may be slightly chamfered, e.g., beveled and/or rounded to avoid chipping and to reduce the occurrence of fractures at sharp edges of the crystalline substrate.

There is a steady need for improving the manufacturing of crystalline substrates and semiconductor devices.

SUMMARY

An embodiment of the present disclosure relates to a method of manufacturing a device substrate. A parent substrate is provided that includes a central region and an edge region. The edge region surrounds the central region. A detachment layer is formed in the central region. The detachment layer extends parallel to a main surface. The detachment layer includes modified substrate material. A groove is formed in the edge region. The groove laterally encloses the central region. The groove runs vertically and/or tilted to the detachment layer.

A further embodiment of the present disclosure relates to a parent substrate. The parent substrate includes a central region and an edge region. The edge region surrounds the central region. A groove in the edge region laterally encloses the central region. The groove runs vertically and/or tilted to the detachment layer. In the central region, a detachment layer extends parallel to the main surfaces and ends at the groove. The detachment layer includes modified substrate material.

BRIEF DESCRIPTION OF THE DRAWINGS

The accompanying drawings are included to provide a further understanding of the embodiments and are incorporated in and constitute a part of this specification. The drawings illustrate embodiments of a crystalline substrate, a wafer composite, a method of manufacturing a crystalline substrate, and a method of manufacturing a semiconductor device and together with the description serve to explain principles of the embodiments. Further embodiments are described in the following detailed description and the claims.

DETAILED DESCRIPTION

Figure 1A:
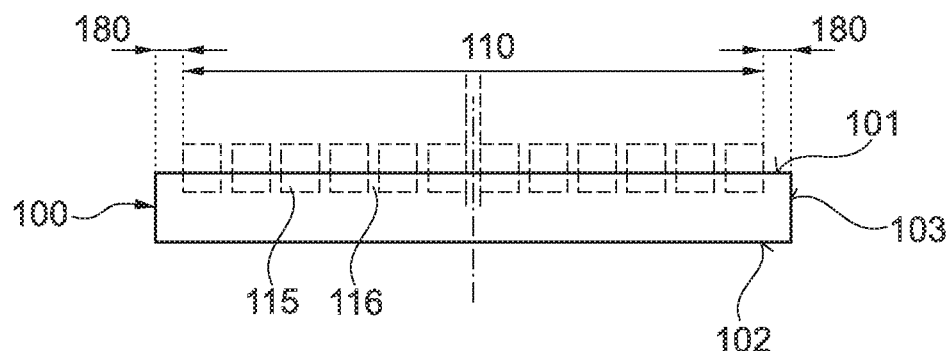
FIGS. 1A-1C illustrate schematic vertical cross-sectional views of a crystalline parent substrate for illustrating a method of manufacturing a device substrate using a groove in an edge region and a detachment layer in a central region according to an embodiment.

In the following detailed description, reference is made to the accompanying drawings, which form a part hereof and in which are shown by way of illustrations specific embodiments in which a device substrate, a wafer composite, a method of manufacturing a device substrate, and a method of manufacturing a semiconductor device may be practiced. It is to be understood that further embodiments may be utilized and structural or logical changes may be made without departing from the scope of the present disclosure. For example, features illustrated or described for one embodiment can be used on or in conjunction with further embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

Ranges given for a parameter include the boundary values. For example, a range for a parameter y from a to b reads as $a \leq y \leq b$. A parameter y with a value of at least c reads as $c \leq y$ and a parameter y with a value of at most d reads as $y \leq d$.

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

The term "power semiconductor device" refers to semiconductor devices with high voltage blocking capability, for example 30V, 100V, 600V, 3.3 kV or more and with a nominal on-state current or forward current of at least 1 A, for example 10 A or more.

According to an embodiment, a method of manufacturing a device substrate may include providing a parent substrate. The parent substrate may be crystalline. That is to say, at least 90% or even at least 95% of the parent substrate may include crystalline material, e.g. polycrystalline material or single-crystalline material. The parent substrate may include a central region and an edge region. The edge region may surround the central region. For example, at least 60% (or at least 70% or even at least 80%) of the parent substrate may be part of the central region.

The parent substrate may be a crystal ingot (boule) of single crystalline material or a wafer-sized slice of single crystalline material (e.g., a wafer). The parent substrate may (except for modified substrate material within a detachment layer) exclusively include the single crystalline material or may include, in addition to a main portion formed from the single crystalline material, modified substrate material in a detachment layer and/or structures of other materials, e.g., conductive structures and/or insulating structures.

The single crystalline material may be a ceramic, e.g. $\alpha$-$Al_2O_3$ (sapphire), or a semiconductor material. The semiconductor material may be, by way of example, any group IV element semiconductor, e.g. silicon (Si) or germanium (Ge), any group IV compound semiconductor, e.g. silicon carbide (SiC) or silicon-germanium (SiGe), or any group III/V compound semiconductor, such as gallium arsenide (GaAs) or gallium nitride (GaN).

For example, the material of the parent substrate may be 15R—SiC (silicon carbide of 15R polytype) or silicon carbide with a hexagonal polytype, for example 2H—SiC, 4H—SiC or 6H—SiC, by way of example. In addition to the main constituents silicon and carbon, the parent substrate may include dopant atoms, for example nitrogen N, phosphorus P, beryllium Be, boron B, aluminum Al, and/or gallium Ga. Further, the parent substrate may include unwanted impurities, for example hydrogen, fluorine, and/or oxygen.

For example, the parent substrate may be a virgin semiconductor wafer or a processed semiconductor wafer. A virgin semiconductor wafer may be a semiconductor wafer at a stage after having been obtained from a crystal ingot, e.g. by sawing, and prior to any conditioning specific for a certain type of semiconductor device. For example, a virgin semiconductor wafer may have been subjected to unspecific processes, e.g., edge rounding, beveling, heat treatments and/or a process that forms a surface oxide. A processed semiconductor wafer may be a semiconductor wafer after having been subjected to at least one device-specific process, e.g., a blanket doping or a patterning process. A processed semiconductor wafer may include spatially separated doped regions, insulator structures and/or conductive structures that include polycrystalline semiconductor material, a metal, and/or a metal compound.

The parent substrate may have two essentially parallel main surfaces of the same shape and size and a lateral outer surface connecting the edges of the two main surfaces. The parent substrate may laterally extend in a plane spanned by lateral directions. Accordingly, the parent substrate may have a surface extension along two lateral directions (also denominated as horizontal directions in the following). The parent substrate may have a thickness along a vertical direction perpendicular to the lateral directions.

Here and in the following, a first and a second face may be "essentially parallel" if an average plane that approximates the first face encloses an angle of at most 5 degree (or at most 2 degree) with an average plane that approximates the second face.

The main surfaces may be oriented completely planar. The main surfaces and the lateral outer surface may be connected via right-angled edges. Alternatively, the lateral outer surface may be chamfered, for example beveled and/or rounded in direction of one of the main surfaces or in direction of both main surfaces.

The lateral outer surface may include a vertical portion running along the vertical direction. In addition to the vertical portion, the lateral outer surface may include one or more beveled portions between the vertical portion and a first one of the main surfaces. In addition, the lateral outer surface may further include one or more beveled portions between the vertical portion and a second one of the main surfaces. Each beveled portion may have another tilt angle with regard to the vertical portion. Alternatively, the lateral outer surface may include a rounded portion between the vertical portion and at least a first one of the main surfaces. The lateral outer surface may include one or more rounded portions between the vertical portion and beveled portion, between neighboring beveled portions and/or between a beveled portion and the respective main surface.

A first main surface at the front side and a second main surface at the back side may have the shape of a polygon (e.g. a rectangle or a hexagon) with or without rounded edges, or a circle with or without a notch or a flat along the circumference.

In a vertical cross-section, the lateral outer surface may be planar, may be outwardly bowed, and/or may include a chamfered portion at least at one of the transitions to the main surfaces. The chamfered portion may be beveled and/or rounded.

The main surfaces may laterally extend in a plane spanned by lateral directions. Accordingly, the parent substrate may have a lateral extension along two orthogonal lateral directions and may have a thickness along a vertical direction perpendicular to the lateral directions.

The parent substrate may be a semiconductor wafer, wherein a diameter and a thickness of the parent substrate may correspond to a production standard for semiconductor wafers. The diameter of the parent substrate may be 4 inch (100 mm), 6 inch (150 mm), 7 inch (175 mm), 200 mm (8 inch) or 300 mm (12 inch).

The central region of the parent substrate may be a circular or almost circular region. In case the parent substrate is a virgin semiconductor wafer, at least the central region may be homogeneously doped. In case of preprocessed semiconductor wafers, the central region may include a plurality of laterally separated device regions, wherein each device region may include a plurality of doped regions, conductive structures and/or insulating structures. The conductive structures and/or the insulating structures may be formed on the parent substrate and/or may extend from the first main surface into the parent substrate. A grid-shaped kerf region may separate the device regions in the central region of the parent substrate.

The edge region may be between the central region and the lateral outer surface of the parent substrate. The edge region may extend from the central region to the lateral outer surface. The edge region may be without device regions. The edge region may completely surround the central region. The edge region may have an approximately uniform width. For example, the edge region may have a mean width of at least 100 µm and at most 3 mm, e.g. at most 1 mm or at most 500 µm. It may be possible that the edge region includes or is defined by a chamfered (e.g., beveled and/or rounded) region of the parent substrate along the lateral outer surface. The chamfered region of the parent substrate may be defined by the lateral extension of the chamfered portion of the lateral outer surface. For example, the edge region may include, e.g. may exclusively include a portion of the lateral outer surface, e.g. the chamfered portion of the lateral outer surface.

A detachment layer may be formed in the central region. The detachment layer may extend parallel to at least one of the main surfaces of the parent substrate or to both main surfaces. The detachment layer may be spanned by and/or may run parallel to the lateral directions.

Before or after or even during forming the detachment layer, a groove may be formed in the edge region. It may also be possible that a part of the groove is formed before forming the detachment layer and a further part of the groove is formed after forming the detachment layer or vice versa a part of the detachment layer is formed before forming the groove and a further part of the detachment layer is formed after forming the groove. The groove may consist of a single, connected groove or of a plurality of sub-grooves that are laterally separated from another. The groove may extend in a direction out of a layer in which the detachment layer is formed.

The groove may extend from one of the main surfaces up to the detachment layer or beyond the detachment layer. A vertical extension of the groove may be at least 80%, e.g. at least 95% and at most 120%, e.g. 105% of a distance between the detachment layer and that main surface, in which the groove is formed. For example, the vertical extension of the groove and the distance between the detachment layer and that main surface, in which the groove is formed, may be equal or approximately equal.

In some embodiments, the groove may extend from at least one of the main surfaces into the parent substrate or may extend from a portion of the lateral outer surface close to one of the main surfaces into the parent substrate. The groove may extend vertically and/or tilted to the detachment layer and/or to the lateral directions. Here and in the following, "tilted" may mean that the groove (e.g., a main axis of the groove) and the detachment layer and/or the lateral directions enclose an angle of at least 5 degree and at most 90 degree. For example, the groove and the detachment layer enclose an angle in a range from 5 degree to 85 degree, e.g. in a range from 5 degree to 45 degree.

An angle of 90 degree is also fulfilled for a "vertical" groove. The main axis of the groove may be the direction along which the groove mainly extends away from the central region. For example, the groove may have its largest extension away from the central region along the main axis. The main axis may run perpendicular or at least tilted to a circumferential direction of the parent substrate.

The groove may include an inner groove sidewall and an outer groove sidewall. The inner groove sidewall may be positioned closer to the central region than the outer groove sidewall. In some embodiments, the groove may end at the detachment layer and the detachment layer may end at the groove. The detachment layer may be in contact with the inner groove sidewall. According to some embodiments, the groove may taper and a blind end of the groove and an outer edge of the detachment layer may merge.

The detachment layer may include modified substrate material. The modified substrate material may form a plurality of laterally separated modified zones. Each modified zone may be arranged along a modified line. In some embodiments, the detachment layer may include a plurality of laterally separated modified zones that are arranged along modified lines and separated by not-modified substrate material. For example, each modified zone may include a plurality of modified regions that arise from essentially single shots with a laser beam into the parent substrate. At least some or all of the modified regions may be connected with and/or may overlap with their neighboring modified region. In addition or as an alternative, it may be possible that at least some or all neighboring modified regions are separated from each other by non-modified substrate material. That is to say, at least some of the modified regions or all of the modified regions may not overlap with neighboring modified regions. The modified lines may run parallel to one another. The modified zones (e.g., the modified lines) may end at the inner groove sidewall. According to another example, the modified zones and the bottom of the groove may merge.

The modified substrate material may include the main constituents of the material of the parent substrate. For example, the modified substrate material may have a phase that is different from the phase of the non-modified material, e.g., a phase that is different from a single crystalline phase. For example, the modified zones may include the main constituents of the substrate material in polycrystalline form, in amorphous form, and/or as a mixture of the elementary constituents of the substrate material. For example, the modified substrate material may include elementary silicon in amorphous and/or polycrystalline form and/or carbon in amorphous and/or polycrystalline form.

According to some embodiments, the detachment layer may include structures of higher porosity, for example of a porosity of at least 20% and/or structures with implantation-induced crystal damage. Implantation-induced crystal damage may include crystal defects decorated with, e.g., hydrogen atoms.

The groove may laterally enclose the central region. For example, the groove may laterally enclose the central region completely. The groove may form a frame for the central region. The groove may have an approximately uniform radial extension (width) along the complete circumference. The groove may have approximately uniform depth along the complete circumference. If the groove includes a plurality of sub-grooves, the sub-grooves may have approximately equal width and/or equal depth along the complete circumference of the central region. In a horizontal plane the groove may include a circular portion or may approximate a circular portion with orthogonal line portions.

For example, the groove may form a complete circle in the horizontal plane. The diameter of the circle may be smaller than the largest inscribed circle of the horizontal substrate shape, which may include one or more flats along the outer circumference. The groove may be vertical or may be tilted in direction to the center of the circle, wherein an angle between a main axis of the groove and the horizontal plane may be in a range from 5 degree to 45 degree, e.g. from 15 degree to 45 degree. The groove may be exclusively formed in a portion of the edge region in which the main surfaces are parallel to each other. Alternatively, the groove may be partly or completely formed in a chamfered and/or rounded portion of the edge region. For example, the groove may be formed completely or in parts in the lateral outer surface.

According to another example, the groove may include one or more straight portions and one or more circular arcs, wherein the one or more straight portions and the one or more circular arcs complement each other to a closed form. The diameter of the circular arcs may be smaller, equal to or greater than the largest inscribed circle of the horizontal substrate shape, which may include one or more flats along the outer circumference. Each straight portion of the groove may run parallel to one flat. The groove may be vertical or may be tilted in direction to the center of the circle, wherein an angle between a main axis of the groove and the horizontal plane may be in a range from 5 degree to 45 degree, e.g. from 15 degree to 45 degree. The groove may be exclusively formed in a portion of the edge region in which the main surfaces are parallel to each other. Alternatively, the groove may be partly or completely formed in a chamfered and/or rounded portion of the edge region. For example, the groove may be formed completely or in parts in the lateral outer surface.

The groove may include an inner groove sidewall at a side oriented towards the central region (e.g., a lateral center) of the parent substrate. The groove may be formed at a distance to the central region. A distance between the groove and the central region may be uniform along the complete circumference. According to another example, the inner groove sidewall may mark the boundary or the transition between the central region and the edge region. A width of the groove may be at least 10 µm. A depth of the groove (e.g., an extension of the groove along the main axis) may be in a range from 10 µm to several hundred µm.

The combination of a circumferential groove and a detachment layer in contact with an inner groove sidewall may facilitate a later splitting of the parent substrate into a device substrate and a reclaim substrate, wherein the device substrate and the reclaim substrate separate along a splitting surface extending laterally through and/or along and/or essentially parallel to the detachment layer. The groove may avoid or at least attenuate edge effects that may adversely affect the formation of a portion of the detachment layer close to the lateral outer surface.

According to an embodiment, the parent substrate may be split along a splitting surface through, e.g. in the detachment layer. The splitting surface may vertically divide the detachment layer into a portion above the splitting surface (e.g., a first parent substrate portion) and into a portion below the splitting surface (e.g., a second parent substrate portion). The splitting divides the parent substrate into a first parent substrate portion (device substrate) and a second parent substrate portion (reclaim substrate). The first parent substrate portion may include the parent substrate portion extending from the first main surface to the splitting surface. The second parent substrate portion may include the parent substrate portion extending from the splitting surface to the second main surface.

Owing to the groove, the splitting process may be independent from edge effects; such edge effects may adversely affect the yield of the splitting process. In addition, it is possible to define a shape of a lateral outer surface of the device substrate or a shape of a lateral outer surface of the reclaim substrate via the shape of the groove. It is also possible to form that substrate portion, which lateral outer surface is not defined by the groove, with a ring-shaped stiffening portion. The stiffening portion may have a greater vertical extension than a central portion of the concerned substrate portion.

That is to say, a device substrate obtained from the splitting process may have intrinsically chamfered edges along the lateral outer surface and/or may be formed with a stiffening ring. Formation of the chamfered edges and/or the stiffening ring requires no additional processes but is already achieved by the splitting process alone. The chamfered edges may reduce the occurrence of chipping and the occurrence of fractures along the lateral outer surface even for device substrates with a thickness that is not accessible for standard chamfering tools. The stiffening ring may mechanically stabilize the device substrate after the splitting process.

In addition or as an alternative, a reclaim substrate obtained from the splitting process may have intrinsically chamfered edges and/or may include a stiffening ring that stabilizes the reclaim substrate after the splitting process. The lateral dimension of the reclaim substrate, e.g. the diameter, may be the same as that of the parent substrate such that rework and/or reuse of the reclaim substrate may use standard tools without changes or with only uncritical changes of the set-up of such standard tools.

For example, when the groove may be formed completely or in parts in the lateral outer surface and extends tilted to the horizontal plane at an angle between 45 degree and 5 degree, the diameters of both the reclaim substrate and the device substrate may be approximately the same. Both the device substrate and the reclaim substrate may be handled with the same tools and the reclaim substrate may be further processed in almost the same way as the device substrate or the parent substrate.

According to an embodiment, in the edge region a distance between the main surfaces of the parent substrate may decrease with increasing distance to a lateral center of the parent substrate and/or with increasing distance to the central region. In other words, the parent substrate may be a semiconductor wafer with the lateral outer surface chamfered at the transition to at least one of the main surfaces. The chamfer may include a bevel that may be rounded or not rounded. The chamfer may contribute to reducing the occurrence of cracks and/or edge chipping effects during transport or handling of the parent substrate. According to other examples the distance between the main surfaces of the parent substrate may be constant within the edge region.

The circumferential groove may decouple formation of the detachment layer from effects of the chamfer on the formation process for the detachment layer. For example, due to the nature of a laser-induced damage layer formation (optical constraints and micro crack length) it may be difficult to form a detachment layer containing laser-induced crystal damage in a way that the laser-induced crystal damage reaches the lateral outer surface to a sufficient degree. In case the detachment layer does not reach the lateral outer surface to a sufficient degree, the crack entry from the lateral outer surface during the splitting process may be difficult and the yield may thus be critical. With the detachment layer ending at the circumferential groove, it is possible to eliminate the need for a detachment layer ending at the lateral outer surface.

Other than an edge trim process that may remove semiconductor material starting from the lateral outer surface, the circumferential groove extending from the direction of one of the main surfaces into the parent substrate may be formed at an early stage of processing. In particular, standard tools for wafer processing at the front side may be used to form the groove, for example, dicing tools, which separate the device regions from each other, or edge trim tools. Formation of the groove can be easily integrated into existing manufacturing lines at low or medium effort.

Other than a horizontal layer etch process that may remove adhesive material adhering the parent substrate to an auxiliary carrier, the circumferential groove extending from one of the main surfaces into the parent substrate may be formed without removing adhesive material and without that residues of the adhesive material may contaminate the parent substrate and/or the tool used for forming the groove.

According to an embodiment, the groove may extend from a first main surface at a front side of the parent substrate into the parent substrate. The front side may be that side of the pattern substrate at which a front side metallization of a semiconductor device, for example the source electrodes and gate electrodes of a power semiconductor device are formed. In this case the groove may be formed at low or medium additional effort with any tool adapted for a pre-dicing process in the framework of a DBG (dice before grind) process, by way of example. The yield of the splitting process may be significantly improved at only low or medium additional effort. According to other examples, the groove may extend from a second main surface opposite to the front side of the parent substrate into the parent substrate.

According to an embodiment, the groove may include an inner groove sidewall. The inner groove sidewall is oriented to the lateral center and/or the central region of the parent substrate. The inner groove sidewall may include a vertical or approximately vertical sidewall section. In this context, the terms "vertical" and "tilted" may refer to the orientation of the sidewall section with respect to the lateral directions. The detachment layer may cut the vertical sidewall section. In other words, the detachment layer, e.g. the modified zones of a detachment layer including laser-induced crystal damage may end at the vertical sidewall section.

With the detachment layer cutting the inner groove sidewall orthogonally or almost orthogonally, propagation of cracks originating from the inner groove sidewall into the direction of the lateral center of the parent substrate may be supported. It is possible to perform the splitting process with high reliability and at high yield.

According to an embodiment, the groove may be spaced from a lateral outer surface of the parent substrate. In other words, the groove may be formed at a distance to the lateral outer surface. For example, the groove may be formed at low additional costs using a dicing blade and/or a laser ablation tool (e.g., a laser dicing tool). An opening of the groove in the first or second main surface may have a width in radial direction. The width of the groove opening may be in a range from at least 10 µm (or at least 30 µm) to at most 1 mm, typically at most 300 µm or at most 100 µm. For example, the groove opening may have a width in a range from 30 µm to 60 µm. A vertical extension of the groove may be chosen such that the groove reaches the detachment layer. For example, the vertical extension of the groove may be in a range from 10 µm to 200 µm, for example in a range from 20 µm to 120 µm (e.g., 60 µm to 120 µm or 30 µm to 60 µm).

According to an embodiment, the groove may extend inwardly from the lateral outer surface. In other words, the groove forms a one-sided indentation with the inner groove sidewall forming the only groove sidewall extending from the main surface into the parent substrate. Starting from the inner groove sidewall, the groove may have an approximately flat groove bottom extending from the inner groove sidewall to the lateral outer surface. A transition between the inner groove sidewall and the groove bottom may be curved. A radial extension of the groove corresponds to the distance of the inner groove sidewall to the outer circumference of the parent substrate. The radial groove extension may be at least 90% and at most 110% of a width of the edge region. For example, the radial extension of the groove may be at least 10 µm (or at least 30 µm) to at most 1 mm, typically at most 300 µm or at most 100 µm. The vertical extension of the groove may be in a range from 10 µm to 200 µm, typically in a range from 20 µm to 120 µm (e.g., 60 µm to 120 µm or 30 µm to 60 µm).

The groove bottom may be parallel to the main surfaces or may be tilted to the main surfaces such that the remaining portion of the parent substrate in the edge region is chamfered, for example beveled with or without rounding.

Forming the groove may include a spiral cut or a sequence of round-cuts with different diameters with a conventional dicing tool, for example, a dicing blade for round cut, wherein the material between the inner groove sidewall and the lateral outer surface may be completely removed.

According to another example, an edge bevel tool may remove the material (e.g., completely or at least 90% of the material) between the inner groove sidewall and the lateral outer surface. The edge bevel tool may be a grinding tool, wherein the shape of an indentation of a grinding pad may be complementary to the vertical cross-sectional shape of the groove. The indentation may be formed such that the device substrate is formed with a chamfer along the outer lateral surface and/or such that the reclaim substrate is formed with a chamfer along the outer lateral surface.

According to an embodiment, forming the groove may include a laser-assisted material removal. The laser-assisted material removal may include directing a laser beam into the direction of and/or onto the first main surface. In an additional or alternative embodiment, the laser-assisted material removal may include directing a laser beam into the direction and/or onto the second main surface. In the latter case, the parent substrate may be attached with the front side down to an auxiliary carrier.

In a further additional or alternative embodiment, the laser-assisted material removal may include directing a laser beam into the direction and/or onto the first main surface. In the latter case, the parent substrate may be attached with the side opposite to the front side down to an auxiliary carrier.

In general, the laser-assisted material removal may include weakening and/or removing material of the parent substrate with the laser beam. The laser-assisted material removal may include or may be at least one of: laser-assisted ablation (e.g., laser dicing) or a laser-assisted etch process. Laser-assisted ablation usually makes use of material removal by melting and/or evaporating and/or sublimating material with a laser beam. The laser-assisted etch process may include weakening and/or converting the material of the parent substrate in a region where the groove is to be formed. The weakened material may, for example, then be removed via etching.

In general, the laser beam may be directed into the direction of a lateral center of the parent substrate. For example, the laser beam may be tilted with respect to the horizontal directions or to both the vertical direction and the horizontal directions. An angle between the vertical direction and a propagation axis of the laser beam may be at least 30 degree. In other embodiments, the angle between the vertical direction and the propagation axis of the laser beam may be at most 10 degree, e.g. at most 5 degree or 0 degree. The laser beam may be a UV laser beam with a peak wavelength between at least 200 nm and at most 450 nm. In other embodiments, the laser beam may a visible or an infrared laser beam, e.g. with a wavelength of at least 1 μm and at most 1.8 μm. Larger wavelengths may also be possible.

The laser-assisted material removal may be controlled such that a groove with a bowed inner groove sidewall is formed. The inner groove sidewall may be bowed inwardly with respect to the groove. The ablation volume of the laser-assisted material removal may be small compared to the ablation volume of a process forming the groove by means of a mechanical dicing tool.

In some embodiments, the splitting process may form the device substrate with an intrinsically outwardly bowed lateral outer surface that may be ab initio less susceptible to edge chipping. The splitting process may form a reclaim substrate with a stiffing ring which sidewalls can be favorably shallow and/or bowed. In other words, it is possible that the stiffing ring does not include steep sidewalls and/or rectangular outer edges such that the stiffing ring may be ab initio less susceptible to edge chipping. The stiffing ring may facilitate the rework and/or reuse of thin reclaim substrates at high yield.

In some embodiments, the splitting process may form a reclaim substrate with an intrinsically outwardly bowed lateral outer surface that is ab initio less susceptible to edge chipping. The device substrate may be formed with a stiffing ring which sidewalls can be favorably shallow and/or bowed. In other words, the stiffing ring does not include steep sidewalls and/or rectangular outer edges such that the stiffing ring can be ab initio less susceptible to edge chipping. The stiffing ring may facilitate the further processing of very thin device substrates obtained from the device substrates at high yield.

Demounting and handling stability for both the device substrate and the reclaim substrate can be significantly improved. Forming the groove from the second main surface may get along without removing any adhesive material or with removing only little adhesive material used for temporarily mechanically connecting the parent substrate with an auxiliary carrier.

According to an embodiment, the method includes connecting an auxiliary carrier and the parent substrate. The first main surface of the parent substrate is oriented to a working surface of the auxiliary carrier. In other words, the first main surface of the parent substrate faces the working surface of the auxiliary carrier. The auxiliary carrier and the parent substrate may be mechanically connected after forming the groove in the first main surface and/or prior to forming the groove in the second main surface. Forming the groove and splitting the parent substrate may leave the auxiliary carrier completely unaffected. The auxiliary carrier may be reworked and reused at low or medium effort.

The auxiliary layer and the parent substrate may be direct bonded or a bonding layer with high thermal stability may bond the first main surface of the parent substrate and the working surface of the auxiliary carrier.

According to an embodiment, connecting the auxiliary carrier and the parent substrate may include forming an adhesive structure between the working surface of the auxiliary carrier and the central region of the parent substrate. For example, adhesive material may be deposited on at least one of the working surface of the auxiliary carrier or the first main surface of the parent substrate. The adhesive material may be deposited in the central region of the parent substrate and/or in a central portion of the working surface, wherein the central portion of the working surface corresponds in size and form to the central region of the parent substrate. It is possible that the adhesive material is not applied in the edge region. For example, the adhesive material may be deposited in a patterned deposition process, or the adhesive material may be only temporarily deposited in the edge region of the parent substrate and later removed from the edge region.

In particular, the groove may be completely or predominantly adhesive-free for the splitting process. The splitting process may remain unaffected from the adhesive and it is possible that no residuals of the adhesive material are set free by the splitting process.

According to an embodiment, connecting the auxiliary carrier and the parent substrate may include forming an adhesive layer between the working surface of the auxiliary carrier and the first main surface of the parent substrate. For example, the adhesive layer may be formed across the entire first main surface. Prior to splitting, an edge portion of the adhesive layer may be released and/or removed selectively with respect to a central portion of the adhesive layer in the central region. An auxiliary radiation beam effective only in the edge region may locally generate heat below a peripheral adhesive portion extending outwardly from the outer groove sidewall and may release the peripheral adhesive portion. According to another example, the adhesion may be released in the edge region, e.g. in the entire edge region and/or including the groove. After removal and/or release of the peripheral adhesive portion, it is possible that the adhesive material does not block the crack entry into the detachment layer for the splitting process.

According to an embodiment, a method of manufacturing a semiconductor device may include providing a device substrate, e.g. a crystalline device substrate, from a parent substrate according to a method as described above. The parent substrate may include a semiconductor material. The parent substrate may be a chamfered semiconductor wafer. A semiconductor device may be formed from a part of the device substrate. Thin semiconductor devices may be formed at low loss of expensive semiconductor material.

According to an embodiment, a parent substrate may include a central region and an edge region. The edge region may surround the central region. The parent substrate may be any of the parent substrates as described above. The parent substrate may include or may consist of crystalline semiconductor material, by way of example.

In the central region of the parent substrate a detachment layer may extend parallel to a main surface. The detachment layer may include modified substrate material. The detachment layer may be any of the detachment layers described above.

In the edge region of the parent substrate, a groove may laterally surround and/or enclose the central region. The groove, e.g. a main axis of the groove, may run vertically and/or tilted to the detachment layer. The groove may be any of the grooves as described above or below. For example, the groove may have been formed with a method as described above or below. The detachment layer may end at the groove. For example, the detachment layer may end at an inner groove sidewall of the groove.

According to an embodiment, a distance between the main surfaces of the parent substrate may decrease with increasing distance to a lateral center of the parent substrate.

According to an embodiment, the groove may include an inner groove sidewall. The inner groove sidewall may include a vertical sidewall section. The detachment layer may cut the vertical sidewall section. The groove may be spaced from an outer edge of the parent substrate. Alternatively, the groove may extend inwardly from the lateral outer surface of the parent substrate.

According to an embodiment, the inner groove sidewall may be inwardly bowed with respect to the groove. Accordingly, a first substrate portion between the detachment layer and the first main surface may be outwardly bowed. The groove may extend from the first or from the second main surface of the parent substrate into the parent substrate.

For example, the groove may form a complete circle in the horizontal plane. The diameter of the circle may be smaller than the largest inscribed circle of the horizontal shape of the parent substrate, wherein the parent substrate may have one or more flats along the outer circumference. The groove may be vertical or may be tilted in direction to the center of the circle, wherein an angle between a main axis of the groove and the horizontal plane may be in a range from 15 degree to 45 degree. The groove may be exclusively formed in a portion of the parent substrate with the main surfaces running parallel to each other. Alternatively, the groove may be partly or completely formed in a portion where the distance between front side and the opposite side decreases, e.g., where the parent substrate shows a chamfer and/or a rounding. For example, the groove may be formed completely or partly in the chamfered and/or rounded part along the edge of the parent substrate.

According to another example, the groove may include one or more straight portions and one or more circular arcs, wherein the one or more straight portions and the one or more circular arcs complement each other to a closed form. The diameter of the circular arcs may be smaller, equal to or greater than the largest inscribed circle of the horizontal shape of the parent substrate, which may include one or more flats along the outer circumference. Each straight portion of the groove may run parallel to one flat. The groove may be vertical or may be tilted in direction to the center of the circle, wherein an angle between a main axis of the groove and the horizontal plane may be in a range from 15 degree to 45 degree. The groove may be exclusively formed in a portion of the edge region in which the main surfaces are parallel to each other. Alternatively, the groove may be partly or completely formed in a chamfered and/or rounded region of the parent substrate. For example, the groove may be formed completely or in parts in the lateral outer surface.

According to an embodiment, a wafer composite may include the parent substrate as described above and an auxiliary carrier. The auxiliary carrier may be attached to the parent substrate, wherein the first main surface of the parent substrate is oriented to a working surface of the auxiliary carrier. In other words, the first main surface faces the working surface.

According to an embodiment, the wafer composite may include an adhesive structure between the auxiliary carrier and the central region of the parent substrate. The adhesive structure may be absent between the auxiliary carrier and the edge region of the parent substrate.

According to a further embodiment, a machining apparatus may include a profile sensor unit and a laser scan unit. The profile sensor unit may obtain shape information about a parent substrate. For example, the profile sensor unit may obtain information about a horizontal shape of the parent substrate. In particular, the profile sensor unit may obtain information about the position and/or dimension of a notch or flat along the circumference of a parent substrate, which—apart from the notch or flat—may have a circular horizontal shape in the rest.

The laser scan unit may direct a laser beam onto the parent substrate. A laser beam axis of the laser beam may be tilted to an exposed main surface of the parent substrate. An angle between the exposed main surface and the laser beam axis may be at least 10 degree and at most 90 degree. The tilt angle is oriented such that the laser beam is directed in direction of a lateral center of the parent substrate.

The impinging site of the laser beam may be close to the outer edge of the parent substrate. For example, the laser beam may impinge in an edge area of the exposed main surface, wherein the edge area is a ring-shaped stripe including the outermost 3 mm of the exposed main surface. Alternatively, the laser beam may impinge on a lateral outer surface of the parent substrate. Alternatively, an impinging site of the laser beam may overlap with both the edge area and the lateral surface area.

A track of the laser beam on the parent substrate is controllable as a function of the shape information obtained from the profile sensor unit. In particular, the laser beam may follow a notch or a flat detected by the profile sensor unit.

According to an embodiment, the machining apparatus may include a stage unit adapted to be reversibly connected with a main surface of the parent substrate. The stage unit may be moveable with respect to the laser beam and/or the laser beam may be moveable with respect to the stage unit such that the laser beam may follow a track along the circumference of the parent substrate. The relative movement between laser beam and stage unit may include a rotational movement, a radial movement, and/or two orthogonal linear movements. The machining apparatus facilitates formation of grooves of any type as described above.

Embodiments of the method described herein may be used for manufacturing embodiments of the crystalline substrate as described herein. In at least some embodiments of the method and/or the crystalline substrate, the following features (if applicable) apply, alone or in combination:
  (i) The detachment layer ends at the groove and/or is in direct contact with the groove.
  (ii) Forming the groove includes a laser-assisted material removal, for example a laser-assisted etch process and/or laser ablation (e.g., laser dicing).
  (iii) The laser-assisted material removal includes directing a laser beam into a first or a second main surface of the parent substrate.

(iv) The laser-assisted material removal includes directing a laser beam completely or partly into a lateral outer surface of the parent substrate, wherein an angle between a propagation direction of the laser beam and a horizontal plane is at least 20 degree, e.g., at least 30 degree.

(v) The laser-assisted material removal includes directing a laser beam completely or partly into a lateral outer surface of the parent substrate, wherein an angle between a propagation direction of the laser beam and a horizontal plane is at most 75 degree, e.g., at most 60 degree.

(vi) The laser beam runs essentially parallel to the vertical direction.

(vii) The edge region is defined by and/or corresponds to a beveled outer region of the parent substrate.

(viii) A transition between the groove bottom and the inner groove sidewall may be rounded.

Figure 1B:
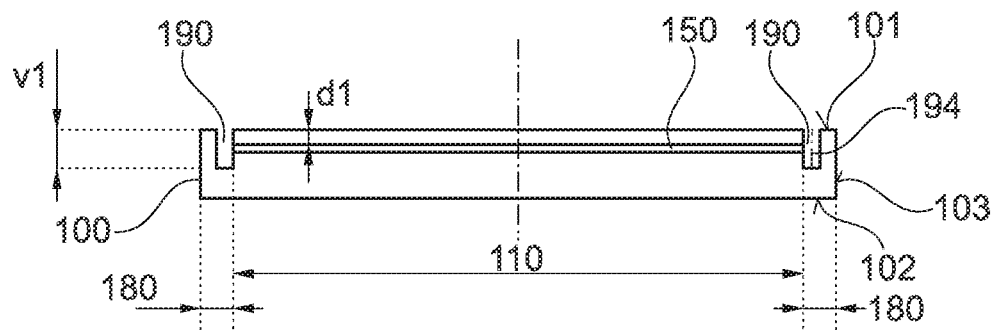
Figure 1C:
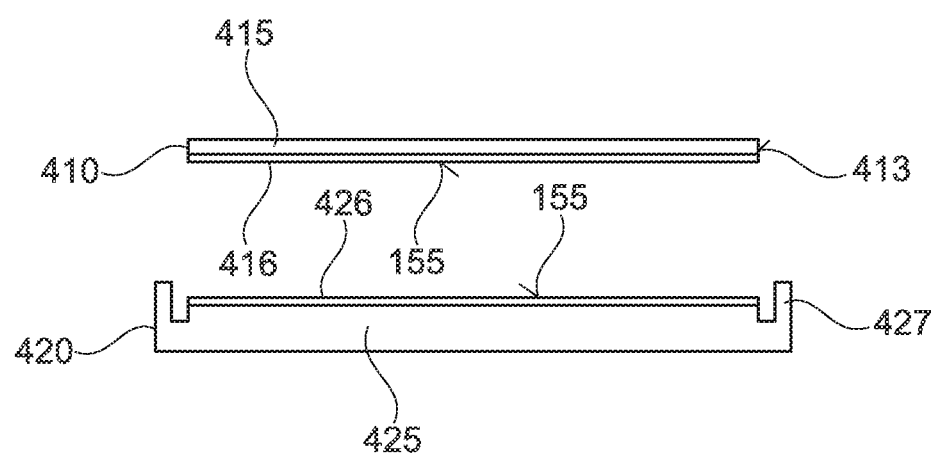

FIGS. 1A-1C illustrate an embodiment with a groove 190 formed at the front side of a crystalline parent substrate 100.

The parent substrate 100 of FIG. 1A may include a ceramic, e.g. sapphire α-$Al_2O_3$, or a semiconductor, for example silicon carbide of a hexagonal polytype. The parent substrate 100 may be a virgin substrate after cut from a crystal boule or may be a processed substrate, e.g., a semiconductor wafer. A first main surface 101 at a front side and a second main surface 102 at a back side extend mainly parallel to each other. The second main surface 102 may have the same shape and size as the first main surface 101. The first and second main surfaces 101, 102 may be approximately planar or may be ribbed. The first main surface 101 and/or the second main surface 102 may be tilted to a plane of a hexagonal crystal lattice of the parent substrate 100 by an off-axis tilt of about 4 degree. A lateral outer surface 103 connects the edge of the first main surface 101 and the edge of the second main surface 102.

The parent substrate 100 may include a central region 110 and an edge region 180 between the central region 110 and the outermost edge of the lateral outer surface 103. The central region 110 may include a plurality of device regions 115. The edge region 180 is free of device regions 115.

The device regions 115 are arranged in lines and rows. A grid-shaped kerf region 116 laterally separates the device regions 115 from each other. Each device region 115 may include at least some of the structures defining an integrated circuit. The integrated circuit may be a power semiconductor device. Each device region 115 may include structures formed on a semiconducting main portion of the parent substrate. For example, a front side metallization may be formed on the semiconducting main portion. The front side metallization may include a first load electrode of a power semiconductor device and, if applicable, a control electrode, for example a gate electrode of an MOSFET (metal oxide semiconductor field effect transistor), an IGBT (insulated gate bipolar transistor), or a JFET (junction field effect transistor).

The groove 190 is formed in the edge region 180. A detachment layer 150 is formed in the central region 110. The detachment layer 150 may be formed prior to or after the groove 190. For example, the detachment layer 150 may be formed prior to the groove 190 to avoid edge effects that may affect the formation of the detachment layer 150 in a region close to the groove 190. According to another example, the groove 190 may be formed prior to the detachment layer 150, wherein the formation of the groove 190 may be combined with front side processing and the formation of the detachment layer may be combined with a back side process, e.g. a laser treatment from the back side.

The detachment layer 150 shown in FIG. 1B may include modified structures that include material of the parent substrate in modified form. The modified structures may include porous material, implantation-induced crystal damage, and/or laser-induced material modifications. The modified stripes are laterally separated by stripes of non-modified material. In addition, the detachment layer may include microcracks extending along main crystal planes, for example along the a-planes. The microcracks may originate at the modified stripes and/or may pass the modified stripes in close vicinity.

A first distance d1 between the detachment layer 150 and the first main surface 101 may be smaller than a first vertical extension v1 of the groove 190. The groove 190 may be formed with a tool suitable for front side processing in the field of manufacturing semiconductor devices. For example, the groove 190 may be formed using an edge trim wheel, a dicing blade, and/or a patterned etch process, for example reactive ion beam etching. Alternatively, the groove may be formed with a dedicated tool designed for forming the groove 190, e.g. by plasma etching using a vertical or tilted laser beam. The groove 190, e.g. a main axis 194 of the groove 190, runs parallel to a vertical direction 104.

Prior to or after forming the groove 190, a grid-shaped dicing grid (not illustrated) may be formed in the kerf region 116. The dicing grid may extend from the first main surface 101 into the parent substrate 100. A vertical extension of the dicing grid may be smaller than the first distance d1 between the first main surface 101 and the detachment layer 150.

In the illustrated example the groove 190 extends from the first main surface 101 at the front side into the parent substrate 100. According to another example (not illustrated) the groove 190 extends from the second main surface 102 on the back side into the parent substrate 100.

In the illustrated example the groove 190 extends vertically into the parent substrate 100. According to another example (not illustrated) the groove 190 is tilted against the vertical direction at an angle in a range from 5 degree to 85 degree in direction of the lateral center of the parent substrate 100, wherein the groove 190 may extend from the first main surface 101 or from the second main surface 102 into the parent substrate 100.

In the illustrated example the groove 190 extends from a horizontal surface section into the parent substrate 100. According to another example (not illustrated) the groove 190 extends partly or completely from a non-horizontal surface section of the first main surface or from a non-horizontal surface section of the second main surface 102 into the parent substrate 100, wherein the groove 190 may be vertical or tilted against the vertical direction at an angle in a range from 5 degree to 85 degree in direction of the lateral center of the parent substrate 100. The non-horizontal surface section may be a chamfered and/or rounded surface portion.

A splitting process may split the crystalline parent substrate 100 along a ribbed splitting surface 155. The splitting surface 155 forms within the detachment layer 150. In case the detachment layer 150 is based on laser-induced modifications of the material of the parent substrate 100, the splitting process may include the application of volumetric lattice stress. The volumetric lattice stress may be applied through ultrasonic waves or by generating thermomechanical stress. For example, a polymer foil may be attached to the first main surface 101 or to the second main surface 102. The parent substrate 100 and the polymer foil may be cooled to below the glass transition temperature of the polymer foil. The polymer foil contracts and induces volumetric lattice stress in the parent substrate 100. The mechanical stress induces the propagation of macro-scale cracks propagating along main lattice planes, e.g. the a-planes, wherein yet existent micro-cracks merge to a ribbed splitting surface 155 that extends mainly laterally through the detachment layer 150. Generation of the splitting surface 155 starts at the exposed edge of the detachment layer 150 in the groove 190. A steep sidewall of a groove 190, which is not filled with a solid material but which may be filled with a fluid, may facilitate a highly reproducible course of the splitting process.

As shown in FIG. 1C, the parent substrate of FIG. 1B splits into a first parent substrate portion and a second parent substrate portion. The first parent substrate portion (device substrate 410) includes a portion of the parent substrate 100 between the first main surface 101 of FIG. 1B and the splitting surface 155. The second parent substrate portion (reclaim substrate 420) includes the portion of the parent substrate 100 between the splitting surface 155 and the second main surface 102 of FIG. 1B.

The device substrate 410 includes a first detachment layer portion 416 and a first substrate portion 415 with a lateral outer surface 413. The reclaim substrate 420 includes a second substrate portion 425 and a second detachment layer portion 426. The reclaim substrate 420 includes a stiffing ring 427 that protrudes above the second detachment layer portion 426 along an outer circumference of the reclaim substrate 420.

Figure 2:
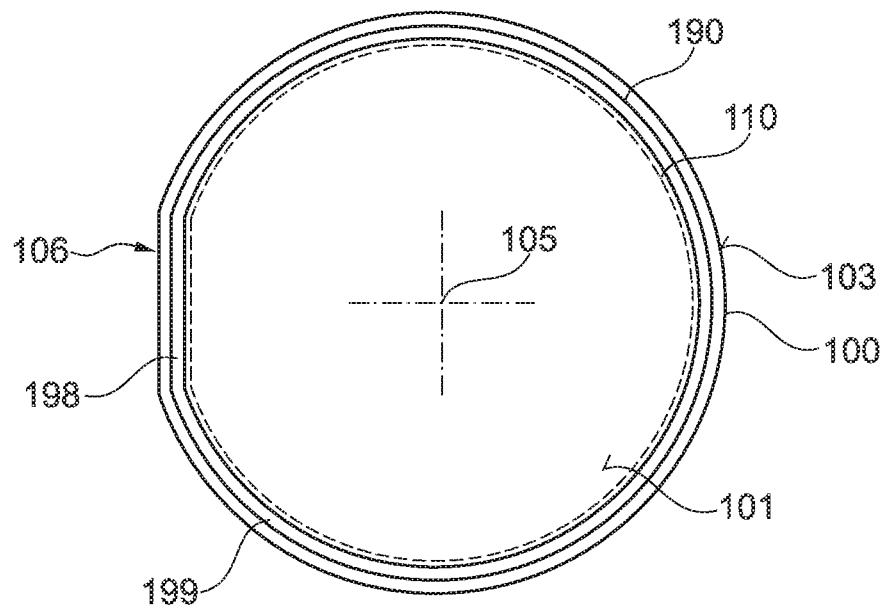
FIG. 2 is a schematic plan view of a parent substrate including a groove in an etch region according to an embodiment.

FIG. 2 shows a schematic plan view of a cylindrical parent substrate 100. As a mere example, a lateral outer surface 103 of the parent substrate 100 includes a flat portion 106. In other embodiments, the lateral outer surface 103 may include a notch portion or may include more than one flat portion. A groove 190 may completely surround a central region 110. The groove 190 may include a circular portion 199 and a linear portion 198. The circular portion 199 may form or may approximate a segment of a circle, wherein a center of the circle coincides with a lateral center 105 of the parent substrate 100. The linear portion 198 may extend parallel to the flat portion 106 of the lateral outer surface 103. The circular portion 199 and the line portion 198 may complement each other to a contiguous frame without interruptions.

The circular portion 199 may form a segment of a circle and may be formed by a point-symmetric process, e.g., a round cut or an edge trim. Alternatively, the circular portion 199 may include orthogonal linear sections such that the groove 190 follows a stepped line that approximates a segment of a circle and wherein the circular portion 199 may be formed by a process tool using Cartesian coordinates, e.g. for generating an etch mask on the first main surface 101.

According to another example (not illustrated) the groove 190 may be a circle.

Figure 3:
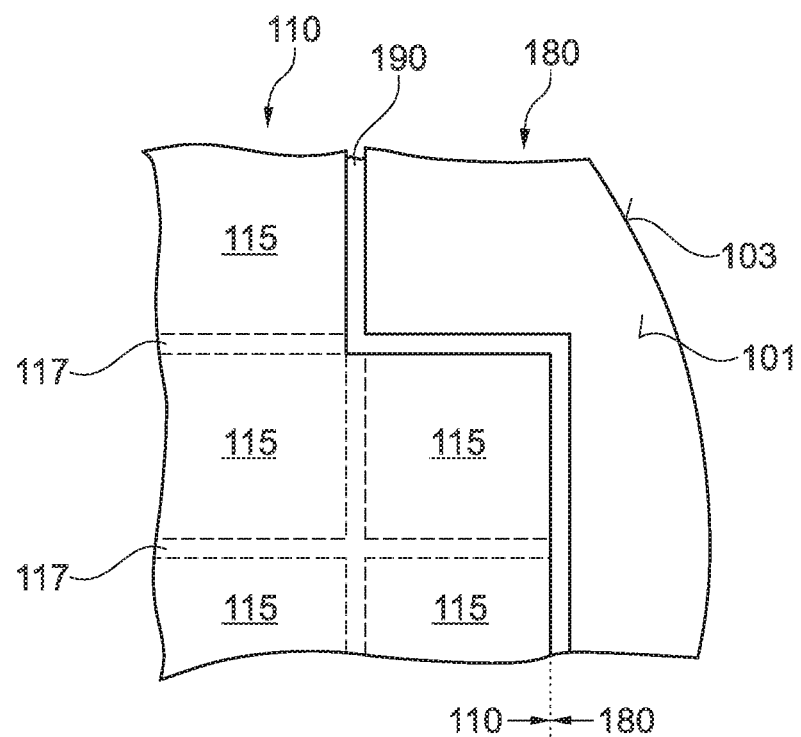
FIG. 3 is a schematic plan view of a portion of a parent substrate from a semiconductor material including a groove between a central region and an edge region according to an embodiment.

FIG. 3 shows a central region 110 including device regions 115 and a grid-shaped dicing grid 117 laterally separating the device regions 115 from each other. A groove 190 separating the device regions 115 from an edge region 180 may include orthogonal linear portions in the lateral projection of the line sections of the dicing grid 117. The groove 190 may have a greater vertical extension than the dicing grid. The groove 190 may have a greater lateral width than the line sections of the dicing grid 117 and/or may have another vertical cross-sectional shape as the lines sections of the dicing grid 117. According to an embodiment, the groove 190 may be laterally separated from the dicing grid 117.

FIGS. 4A-4E show vertical cross-sections of grooves 190 extending from a first main surface 101 into a parent substrate 100 as well as possible positions of the detachment layer 150 in relation to the groove 190. The parent substrate 100 includes a chamfer 185 between the outer edge of the first main surface 101 and a straight vertical portion at the outermost edge of the lateral outer surface 103. The chamfer 185 forms part of the lateral outer surface 103. Main axes 194 of the grooves 190 run vertically or tilted to a vertical direction 104.

Figure 4A:
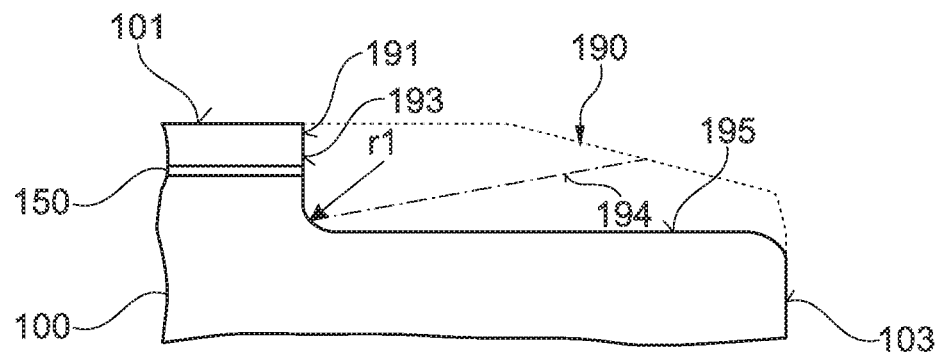
FIGS. 4A-4E are schematic vertical cross-sectional views of an edge region of a parent substrate with grooves of different shape according to embodiments.

In FIG. 4A the groove 190 extends inwardly from the lateral outer surface 103. The groove 190 has only an inner groove sidewall 191 oriented to the lateral center of the first main surface 101. A radial extension (width) of the groove 190 is equal to the distance of the inner groove sidewall to the outer circumference of the parent substrate. The radial groove extension may be at least 90% and at most 110% of a width of the edge region.

A groove bottom 195 may extend approximately in a plane parallel to the first main surface 101. According to other examples, the groove bottom 195 may slightly fall or may slightly rise with decreasing distance to the lateral outer surface 103.

A transition between the groove bottom 195 and the inner groove sidewall 191 may be rounded, wherein a radius r1 of the rounding may be in a range from 0.5 µm to 50 µm, typically in a range from 1 µm to 15 µm or in a range from 20 µm to 30 µm. This rounded transition between the groove bottom and the inner groove sidewall may arise from the tool (e.g., a dicing tool, a trimming tool and/or a grinding tool) used for preparing the groove. Owing to mechanical abrasion of the tool, the groove may not be cut precisely but rather is rounded. The radius caused by tool may be taken into account when preparing the groove, for example when defining the width and/or the vertical extension of the groove. Between the first main surface 101 and the rounding, the inner groove sidewall 191 may include a vertical or approximately vertical sidewall section 193. The detachment layer 150 may cut the inner groove sidewall 191 in the vertical sidewall section 193.

Figure 4B:
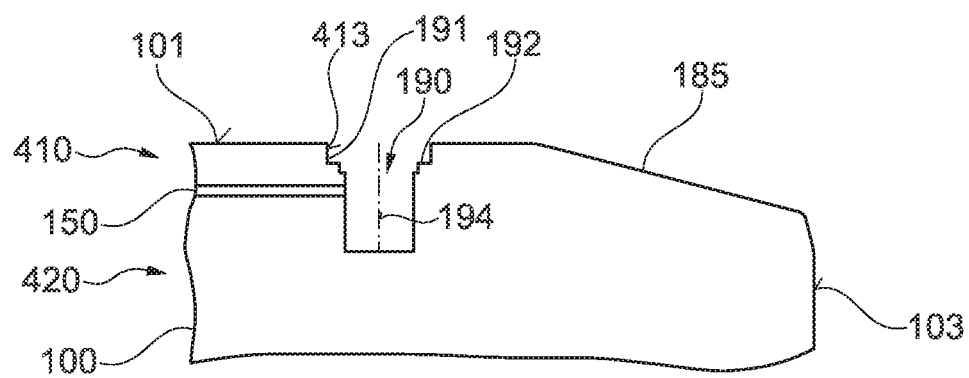
Figure 4C:
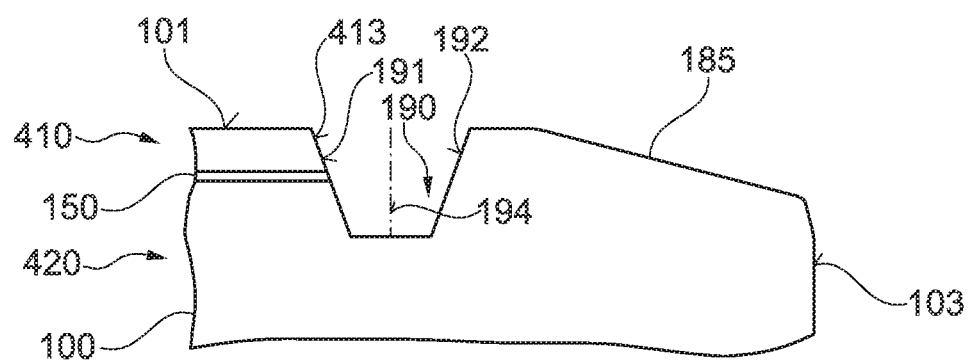

FIGS. 4B and 4C refer to grooves 190 with symmetrically formed inner and outer groove sidewalls 191, 192. The width of the grooves 190 in radial direction with respect to a lateral center of the parent substrate may decrease with increasing distance to the first main surface 101 in steps as illustrated in FIG. 4B or continuously as illustrated in FIG. 4C. The openings of the grooves 190 in the first main surface 101 have a width in radial direction.

A portion of the inner groove sidewall 191 between the first main surface 101 and the detachment layer 150 defines the lateral outer surface 413 of a device substrate 410 that may be obtained from the parent substrate 100 by splitting along a splitting surface through the detachment layer 150. The stepped or tilted groove sidewalls 191 yield advanced etch profiles for the device substrate 410. Edge chipping and the risk of breakage during dismount can be reduced at least for process steps that handle the device substrate 410 directly after the splitting process. The tilted and/or stepped inner groove sidewalls 191 may facilitate edge beveling of thin and ultrathin substrate portions. A thin or ultrathin substrate portion may have a diameter in the range of usual wafer diameters and a thickness of at most 120 µm, for example at most 80 µm or even at most 60 µm. The outer groove sidewall 192 may define the shape of the inner sidewall of the stiffing ring 427 of the reclaim substrate 420.

Figure 4D:
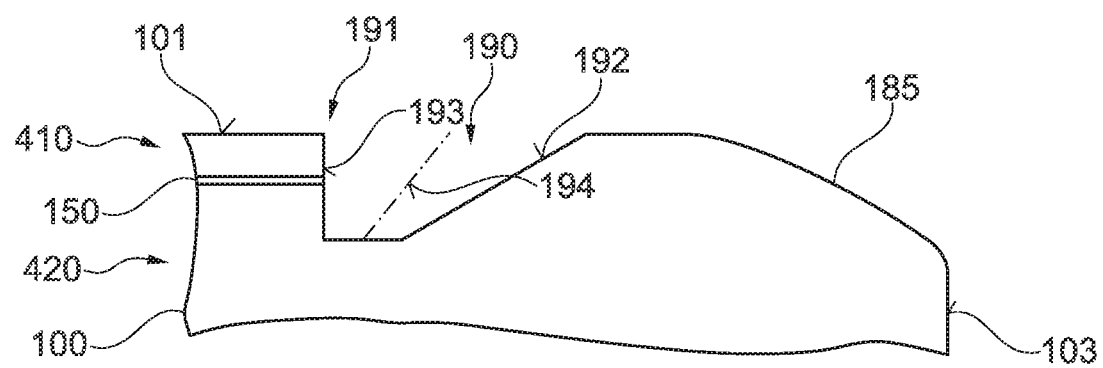
Figure 4E:
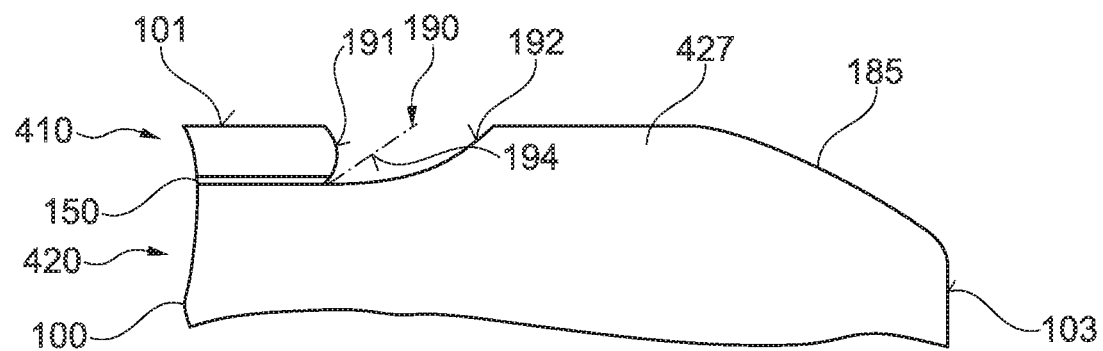

FIGS. 4D-4E refer to asymmetric inner and outer groove sidewalls 191, 192. For example, the inner groove sidewall 191 may include a steeper section as the outer groove sidewall 192. In the steep or almost vertical sidewall section 193 the detachment layer 150 may cut the inner groove sidewall 191 orthogonally or almost orthogonally for a reliable splitting process induced by volumetric lattice stress. Above and/or below the vertical sidewall section 193, the inner groove sidewall 191 may be slightly rounded or beveled. The outer groove sidewall 192 may be significantly shallower than the inner groove sidewall 191. The chamfer 185 and the inner groove sidewall 192 define the sidewalls of a stiffing ring 427. A stiffing ring 427 with shallow sidewalls may be robust against chipping and may facilitate a less complicate handling of the reclaim substrate 420.

In FIG. 4E the groove 190 may be formed by plasma etching that may use a tilted laser beam. The groove 190 may taper with increasing distance to the first main surface 101. The inner groove sidewall 191 may be bowed. The bow may extend inwardly with respect to the groove 190 and outwardly with respect to the device substrate 410. In addition, the outer sidewall 192 may be outwardly bowed with respect to the groove 190 and inwardly bowed with respect to the stiffing ring 427. The detachment layer 150 may end at or in close vicinity to the blind end of the tapering groove 190.

According to other examples (not illustrated), the grooves 190 as described with reference to FIGS. 4A-4E extend from the second main surface 102 into the parent substrate 100.

FIGS. 5A-5G illustrate a method of manufacturing a semiconductor device, for example a vertical silicon carbide power semiconductor device.

Figure 5A:
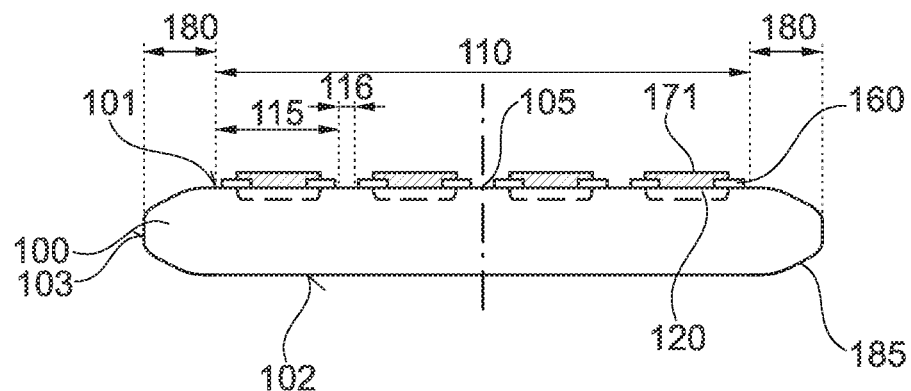
FIGS. 5A-5G are schematic vertical cross-sectional views of a parent substrate based on a semiconductor material and of wafer composites including the parent substrate for illustrating a method of manufacturing semiconductor devices according to an embodiment.

FIG. 5A shows a parent substrate 100, which may be a processed chamfered silicon carbide wafer with a standard diameter and with a standard thickness. The parent substrate 100 includes a central region 110 and an edge region 180 surrounding the central region 100. The edge region 180 separates the central region 110 from a lateral outer surface 103. In the edge region 180 the parent substrate 100 includes a chamfer 185. The chamfered portion may include bevel planes and/or roundings, e.g., roundings between neighboring bevel planes and between bevel planes and the main surfaces 101, 102.

The central region 110 includes a plurality of device regions 115. The edge region 180 is free of device regions 115. The device regions 115 are arranged in lines and rows and a grid-shaped kerf region 116 laterally separates the device regions 115 from each other. In each device region 115, several doped regions may be formed. For example, the parent substrate 100 may have a background doping of a first conductivity type and each device region 115 may include one or more emitter regions 120 of a complementary second conductivity type. The emitter regions 120 may be in contact with the first main surface 101. The emitter regions 120 may be the anode regions of power semiconductor diodes or may include body regions of power switching devices including transistor cells. A front side metallization 171 may be formed on the first main surface 101. The front side metallization 171 may be in contact with the emitter regions 120. Portions of an interlayer dielectric 160 may be formed between portions of the front side metallization 171 and the first main surface 101. Passivation structures (not illustrated) may cover edges of the front side metallization 171. A groove 190 may be formed in the edge region 180.

Figure 5B:
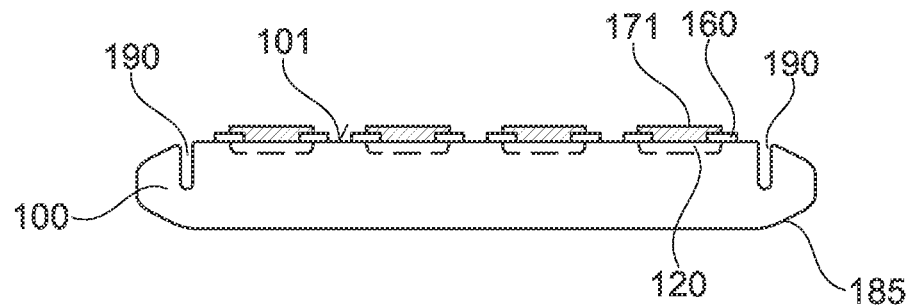

FIG. 5B shows the groove 190 extending from the first main surface 101 into the parent substrate 100. The groove 190 may be formed in a horizontal main section of the first main surface 101 and may have any of the cross-sectional shapes as described with reference to FIGS. 4A-4E, by way of example. In addition, a grid-shaped dicing grid (not illustrated) may be formed in the kerf region 116, wherein a vertical extension of the dicing grid may be smaller than a vertical extension of the groove 190.

An auxiliary carrier 300 may be attached to the front side of the parent substrate 100. For example, an adhesive layer 200 may adhesion-bond the auxiliary carrier 300 onto the first main surface 101 with the front side metallization 171. The adhesion layer 200 may be formed from a temporary bonding/debonding adhesive. For example, liquid glue may be applied onto the front side of the parent substrate 100. The glue may fill at least partly the groove 190 and voids between neighboring portions of the front side metallization 171. A pre-bake may dry the glue and/or may remove a portion of a solvent contained in the glue. The auxiliary carrier 300 may be brought into contact with an exposed top surface of the dried glue. The dried glue may be cured, for example through illumination with ultraviolet radiation, to form the adhesive layer 200.

A laser beam 800 may be directed to the exposed second main surface 102 of the parent substrate 100 to form a detachment layer 150 in the central region 110 as shown in FIG. 5A.

Figure 5C:
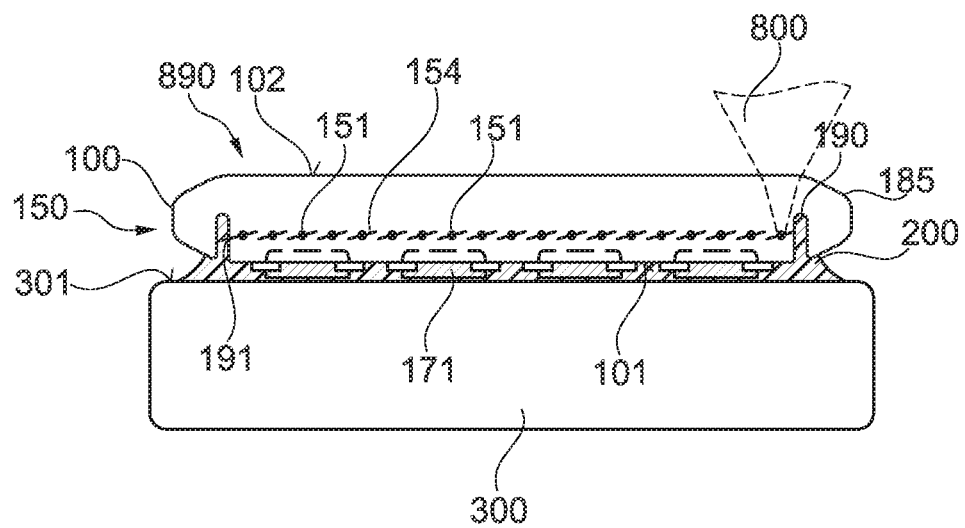

FIG. 5C shows a wafer composite 890 including the parent substrate 100 with the front side adhesion-bonded to a working surface 301 of an auxiliary carrier 300. The auxiliary carrier 300 may be a glass plate, a sapphire plate or may include a plate from the material of the main portion of the parent substrate 100. For example, the auxiliary carrier 300 may include polycrystalline or crystalline silicon carbide. The adhesive layer 200 may fill spaces between neighboring portions of the front side metallization 171. The adhesive layer 200 may fill the groove 190 and may form a meniscus spanning from the chamfer 185 of the parent substrate 100 to the working surface 301 of the auxiliary carrier 300.

The laser beam 800 penetrates through the second main surface 102 at the back side of the parent substrate 100 and forms modified structures 151 in a detachment layer 150. The modified structures 151 may include another phase of the semiconductor material of the parent substrate 100, for example elemental silicon and elemental carbon, for example amorphous carbon. The modified structures 151 may form modified stripes extending orthogonal to the cross-sectional plane. In addition, the detachment layer 150 may include microcracks 154 generated by mechanical stress induced by the thermal heating through the laser beam 800 and/or volume expansion through the phase change of the semiconductor material. The detachment layer 150 cuts the inner groove sidewall 191. In other words, the microcracks 154 of the detachment layer 150 may end at the inner groove sidewall 191.

According to the example illustrated in FIGS. 5A-5C, the groove 190 is formed at the front side of the parent substrate 100 prior to attaching the parent substrate 100 with the front side down to the auxiliary carrier 300. According to another example (not illustrated), the groove 190 is formed at the back side of the parent substrate 100, e.g. after attaching the parent substrate 100 with the front side down to the auxiliary carrier 300.

Figure 5D:
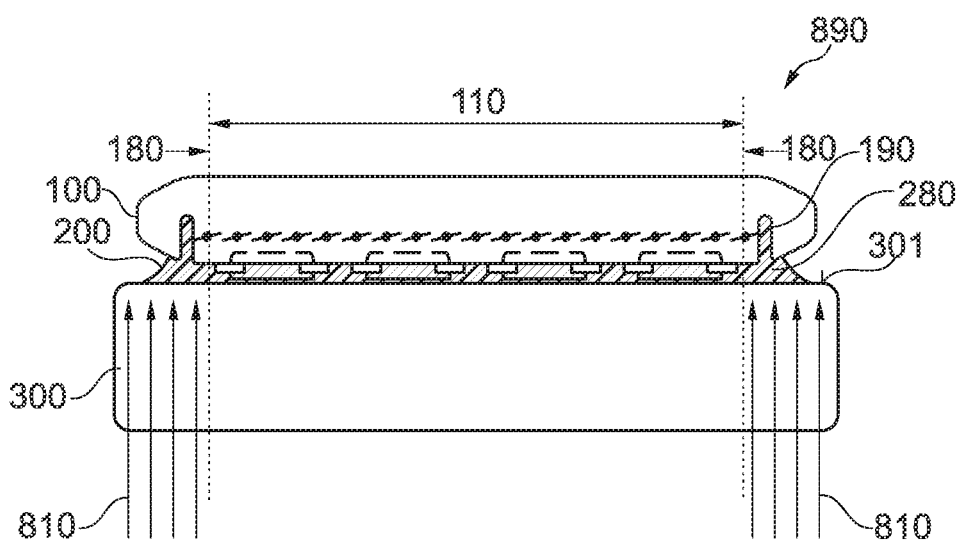

Prior to or after forming the detachment layer 150 an auxiliary radiation beam 810 may be directed onto a peripheral adhesive portion 280 of the adhesive structure 200 as illustrated in FIG. 5D. For example, the auxiliary radiation beam 810 may be directed exclusively onto the peripheral adhesive portion 280 through the auxiliary carrier 300.

Figure 5E:
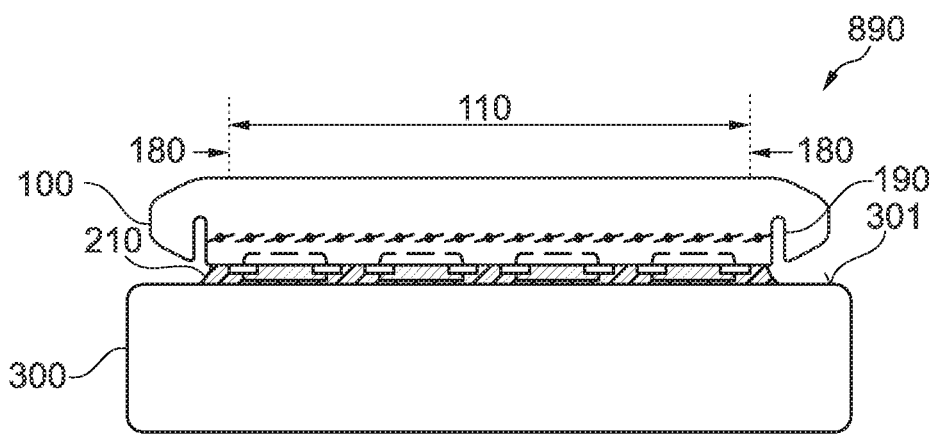

FIG. 5E shows a wafer composite 890 including the parent substrate 100 and the auxiliary carrier 300 after removal of the peripheral adhesive portion 280. A central adhesive portion forms an adhesive structure 210 that connects the parent substrate 100 and the auxiliary carrier 300. The groove 190 is free from solid material and may be filled with a fluid, for example with ambient air or a process gas.

A splitting process induced by volumetric lattice stress is carried out. The volumetric lattice stress may be induced by application of ultrasonic waves or by a polymer foil attached to the second main surface 102 at the back side of the parent substrate 100 and cooled down to below the glass transition temperature of the polymer foil.

Figure 5F:
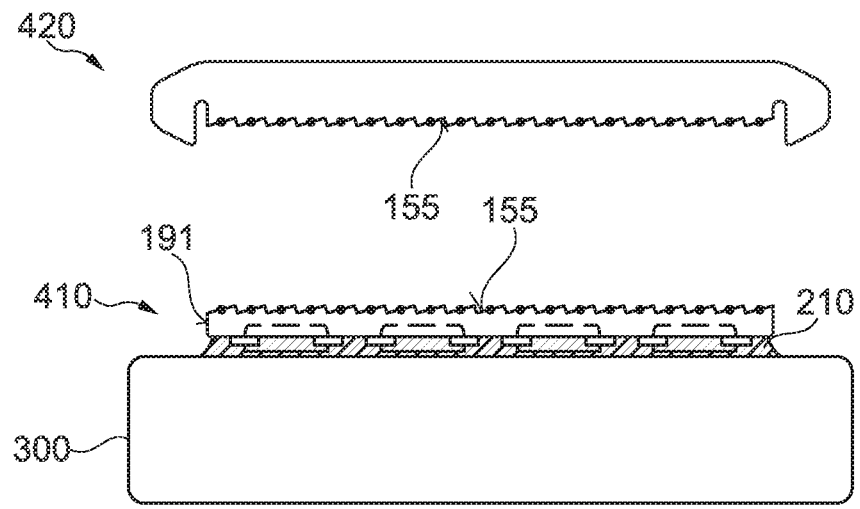

As illustrated in FIG. 5F the detachment layer 150 of FIG. 5E splits along a ribbed splitting surface 155 that ends at the inner groove sidewall 191. A first parent substrate portion between the first main surface 101 and the splitting surface 155 may form a device substrate 410 with a thickness of less than 200 μm, for example less than 100 μm or less than 50 μm. From the device substrate 410, a thin device substrate may be obtained as described below. A second parent substrate portion between the second main surface 102 and the splitting surface 155 forms a reclaim substrate 420. From the reclaim substrate 420 a further device substrate may be obtained by suitable processes.

The ribbed splitting surface 155 may be planarized, for example grinded and/or polished, e.g., in a chemical/mechanical polishing process and/or by a heat treatment in an atmosphere containing hydrogen. The planarizing process may include exposing a dicing grid provided that a dicing grid is formed according to a DBG approach. Backside processing for finalizing a vertical power conductor device may be performed. The backside processing may include implanting dopants of at least one conductivity type and forming a back side metallization.

Figure 5G:
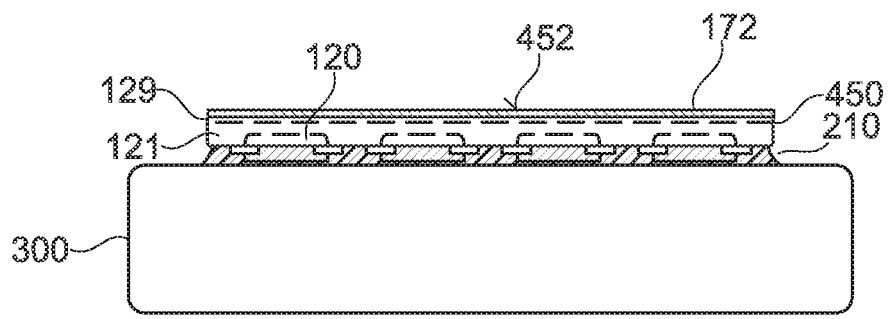

FIG. 5G shows a processed device substrate 450 obtained from the device substrate 410 of FIG. 5F. The processed device substrate 450 includes a heavily doped contact region 129 formed along a back side surface 452 and a voltage sustaining layer 121 formed between the contact region 129 and the emitter regions 120. The voltage sustaining layer 121 may include a low-doped drift zone and/or a superjunction structure with comparatively heavily doped p-type columns and n-type columns extending in a vertical direction. A back side metallization 172 may be formed on the back side surface 452.

Figure 6A:
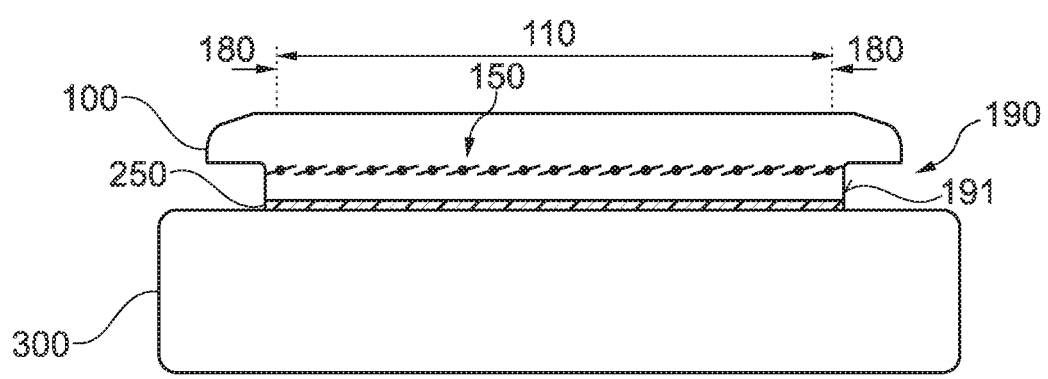
FIGS. 6A-6C are schematic vertical cross-sectional views of a parent substrate based on a semiconductor material and of wafer composites including the parent substrate for illustrating a method of manufacturing semiconductor devices according to an embodiment including layer transfer and epitaxial growth.
Figure 6B:
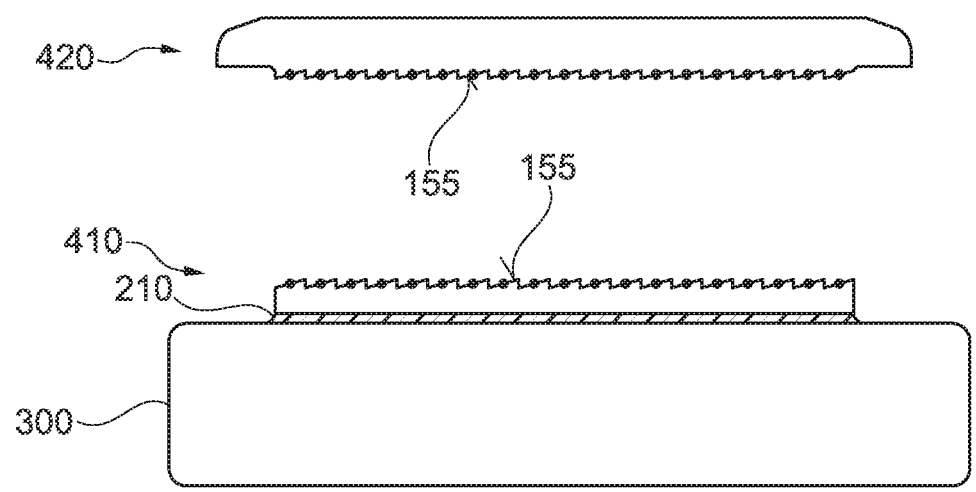
Figure 6C:
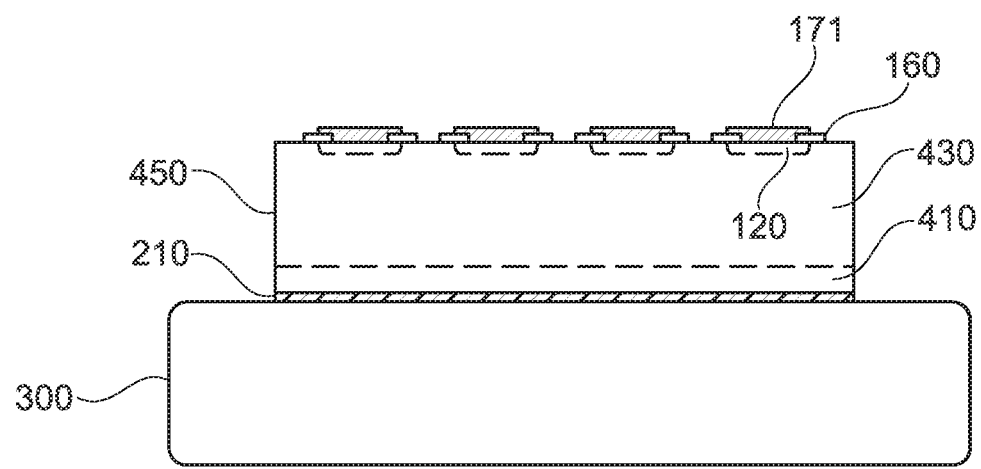

FIGS. 6A-6C refer to a layer transfer process combined with an epitaxy process, wherein the transfer layer may be obtained from a semiconductor wafer by a splitting process as described above.

A groove 190 is formed in the edge region 180 of a parent substrate 100, for example by an edge trim. The first main surface 101 at the front side of the parent substrate 100 is attached to an auxiliary carrier 300. For example, the first main surface 101 and the working surface 301 of the auxiliary carrier 300 may be direct-bonded to each other. According to the illustrated embodiment, a thermally stable bonding layer 250 may be provided between the first main surface 101 of the parent substrate 100 and the working surface 301 of the auxiliary carrier 300. A detachment layer 150 is formed in the parent substrate 100 as described above.

FIG. 6A shows the detachment layer 150 ending at an inner groove sidewall 191. The bonding layer 250 mechanically connecting the auxiliary carrier 300 and the parent substrate 100 may be or may include a silicon nitride layer, a structured layer containing silicon nitride, a layer including heavily doped crystalline silicon carbide and/or polycrystalline silicon carbide, by way of example. The auxiliary carrier 300 may consist of or may include the material of the parent substrate 100. In case the parent substrate 100 is a silicon carbide crystal, the auxiliary carrier 300 may also be a silicon carbide crystal, for example a silicon carbide crystal with inferior crystal quality.

A splitting process as described above separates a second parent substrate portion (reclaim substrate 420) from a first parent substrate portion (device substrate 410) along a ribbed splitting surface 155 horizontally extending through the detachment layer 150 of FIG. 6A.

As shown in FIG. 6B the ribbed splitting surface 155 of the device substrate 410 may be polished and/or planarized to some degree, wherein the height of the ribs may be reduced. The device substrate 410 represents a transfer layer suitable as starting layer for an epitaxy process. An epitaxial layer may be formed on the device substrate 410. Front side processing may form structures of integrated circuits in and/or on the epitaxial layer.

FIG. 6C shows a processed device substrate 450 including the device substrate 410 and an epitaxial layer 430 obtained by epitaxial growth on the device substrate 410. Emitter regions 120, an interlayer dielectric 160 and a front side metallization 171 may be formed in and/or on the epitaxial layer 430 as described above.

The processed device substrate 450 may be separated from the auxiliary carrier 300. For example, the bonding layer 250 may be selectively removed or a further laser-induced splitting process may be effective on an upper portion of the auxiliary carrier 300.

Figure 7A:
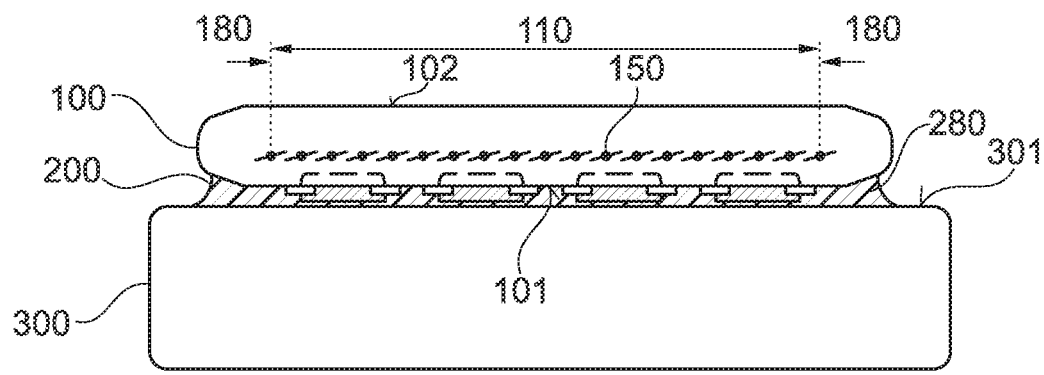
FIGS. 7A-7B are schematic vertical cross-sectional views of a parent substrate based on a semiconductor material and of wafer composites including the parent substrate for illustrating a method of manufacturing semiconductor devices according to an embodiment related to the formation of a groove on a substrate back side.
Figure 7B:
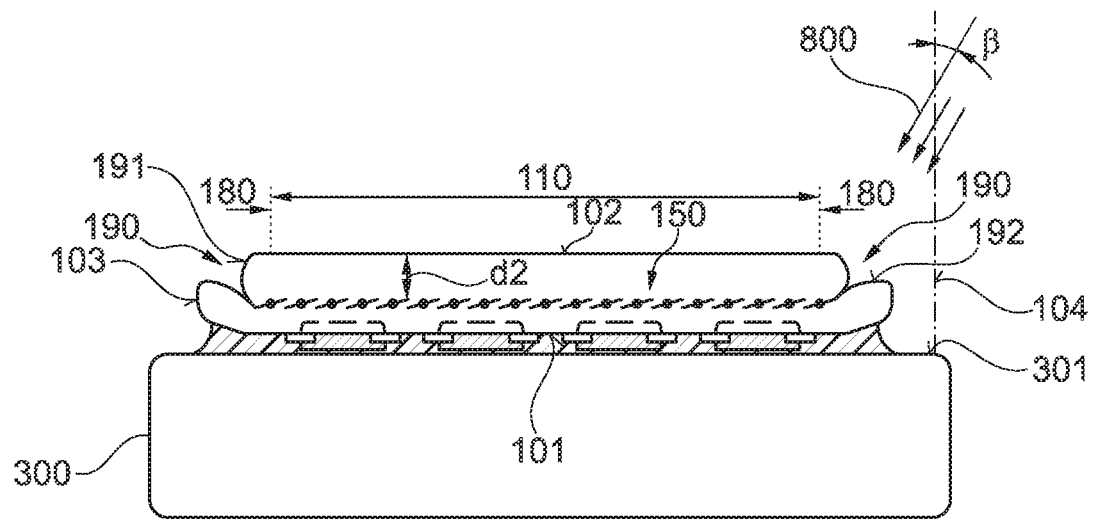

FIGS. 7A-7B refer to a method of forming the groove 190 after mounting the parent substrate 100 onto an auxiliary carrier 300.

As shown in FIG. 7A the parent substrate 100 may be a parent substrate as described with reference to FIG. 5A. The parent substrate 100 may be connected with the front side down with the auxiliary carrier 300 through an adhesive layer 200. A tilted laser beam 800 may be directed from the back side onto the second main surface 102.

The laser beam 800 may impinge vertically on the second main surface 102, wherein vertical grooves may be formed that extend from the second main surface 102 into the parent substrate 100. The grooves 190 may have any of the shapes as described with respect to FIGS. 2 and 4A-4F for grooves that extend from the first main surface 101 into a parent substrate 100.

According to the illustrated embodiment, a propagation axis 801 of the laser beam 800 is tilted to a vertical direction 104 by a tilt angle β. The tilt angle β may be in a range from 10 degree to 80 degree, by way of example. The laser beam 800 may induce a plasma etch, which may be controlled to form a tapering groove 190 that ends in a plane of the detachment layer 150. Alternatively, the groove 190 may cut the plane of the detachment layer 150 and/or may be slightly laterally displaced from the detachment layer 150 by some microns. For example, the vertical extension of the groove 190 with respect to the second main surface 102 may be equal to or greater than a second distance d2 between the second main surface 102 and the detachment layer 150.

The shape of the inner groove sidewall 191 and the shape of the outer groove sidewall 192 may be controlled by parameters of the plasma etch, for example energy, angle and impinging area. For example, the inner groove sidewall 191 may be inwardly bowed with respect to the groove 190 and outwardly bowed with respect to the portion of the parent substrate 100 between the second main surface 102 and the detachment layer 150. Accordingly, the outer groove sidewall 192 may be formed to extend inwardly with respect to the groove 190 and outwardly with respect to the substrate portion between the first main surface 101 and the detachment layer 150.

According to the example illustrated in FIGS. 7A-7B, the groove 190 is formed at the back side of the parent substrate 100 after attaching the parent substrate 100 with the front side down to the auxiliary carrier 300. According to another example (not illustrated) the groove 190 is formed at the front side of the parent substrate 100 prior to attaching the parent substrate 100 with the front side down to the auxiliary carrier 300.

Figure 8A:
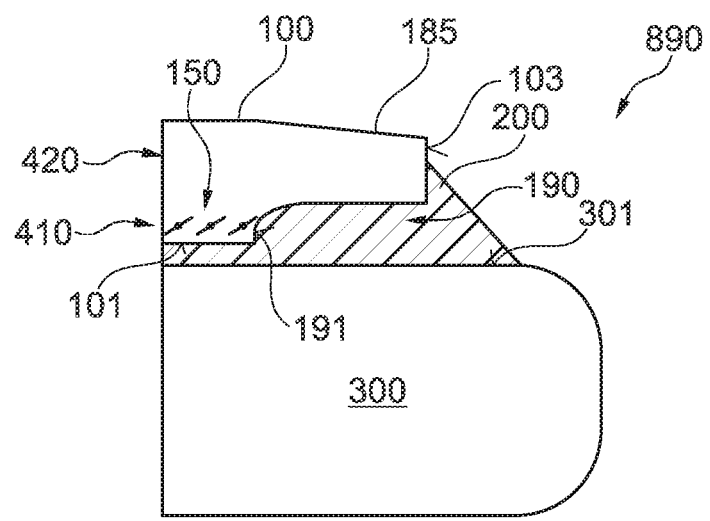
FIGS. 8A-8B are schematic vertical cross-sectional views of a portion of a wafer composite and a trimming tool according to an embodiment referring to an edge trim.

FIG. 8A shows a portion of a wafer composite 890 including a parent substrate 100 with a chamfer 185, a groove 190 and a detachment layer 150 cutting a vertical sidewall section 193 of the inner groove sidewall 191. The chamfer 185 is a part of an outer lateral surface 103. An adhesive layer 200 formed between the first main surface 101 of the parent substrate 100 and a working surface 301 of an auxiliary carrier 300 mechanically connects the parent substrate 100 and the auxiliary carrier 300.

Forming the groove 190 before mounting the parent substrate 100 onto the auxiliary carrier 300 avoids the ablation of debris and may be performed with existing tools, for example a conventional edge trimmer. The edge trimming process may be comparatively fast and cheap. Existing tools for edge trimming allow for a fast integration of the process in a process line. The auxiliary carrier 300 remains unharmed and may be reused without extensive rework.

Figure 8B:
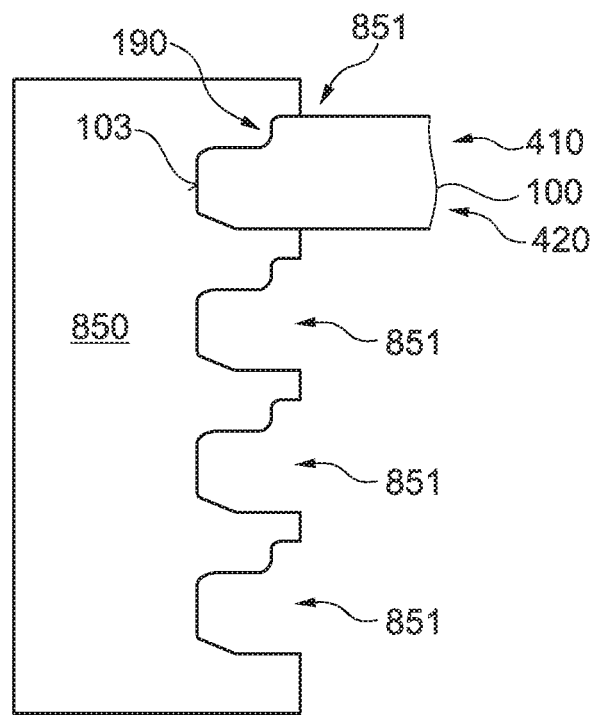

FIG. 8B shows a grinding pad 850 of a bevel wheel etch trimmer. The shape of an indentation 851 of the grinding pad 850 may shape the outer lateral surface 103 of the parent substrate 100, wherein a groove 190 is formed at the front side of the parent substrate 100. In addition, the grinding pad 850 may shape bevels along the outer lateral surface of the device substrate 410 and the reclaim substrate 420. Multiple indentations 851 may reduce process time.

Figure 9A:
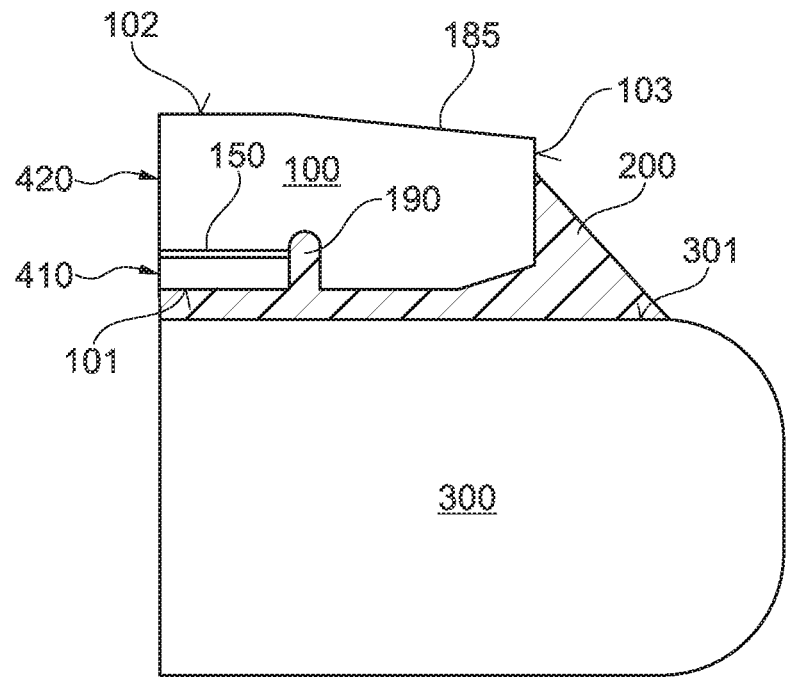
FIGS. 9A-9B are schematic vertical cross-sectional views of a portion of a wafer composite according to further embodiments referring to the formation of a groove from the front side.

In FIG. 9A the groove 190 extends from the first main surface 101 into the parent substrate 100. The groove 190 is formed at a distance to the lateral outer surface 103. Forming the groove 190 may include a cut with a round-cut blade. Forming the groove 190 may, in addition or as an alternative, include linear dicing and/or grinding in a portion parallel to a flat portion of the lateral outer surface 103. Alternatively, the groove 190 may be formed by at least one of: (i) a laser ablation process or a laser-assisted etch process, for example by using UV (ultraviolet) laser radiation, (ii) a plasma and/or patterned etch process, e.g., RIE (reactive ion beam etching) and/or (iii) electrical discharge machining (EDM) and/or electro-chemical discharge machining (ECDM).

Figure 9B:
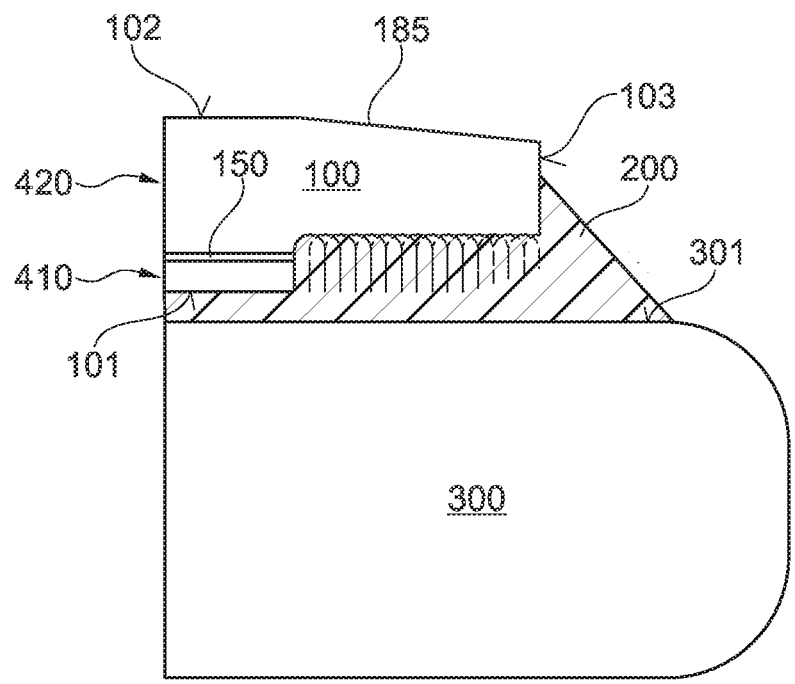

According to FIG. 9B a spiral cut or a plurality of round-cuts with different diameters may form a groove 190 that extends outwardly up to the lateral outer surface 103.

Figure 10:
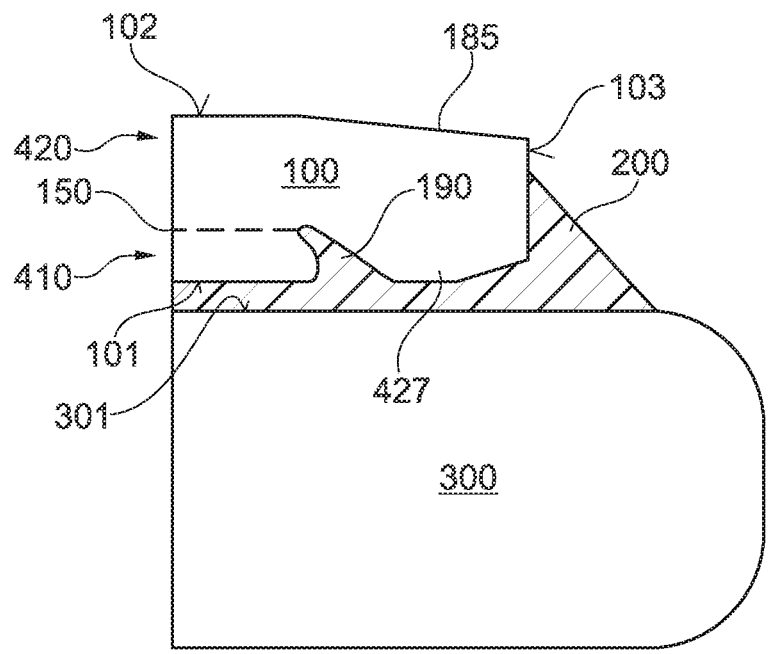
FIG. 10 is schematic vertical cross-sectional view of a wafer composite according to an embodiment referring to front side machining.

FIG. 10 shows a groove 190 formed by front side micro machining. The process may use UV ablation using a tilted laser beam. The ablation volume may be comparatively small and both a chamfered device substrate 410 and a reclaim substrate 420 with chamfered stiffing ring 427 may be formed.

FIGS. 11A-11D refer to embodiments using back side micro machining. The process may use UV ablation using a tilted laser beam. The process may be performed after mounting the parent substrate 100 onto an auxiliary carrier 300. The tilted laser beam 800 may be controlled to form both a chamfered reclaim substrate 420 and a device substrate 410 with chamfered stiffing ring 417. The impinging site for the ablation laser beam 800 may be selected to achieve both a favorably chamfered reclaim substrate 420 and a favorably shaped stiffing ring 417. Alternatively or in addition, the impinging site for the ablation laser beam 800 may be selected to avoid ablation of a portion of the adhesive layer completely or to a high degree.

Forming the grooves 190 may include a laser-assisted material removal, wherein the laser-assisted material removal may include directing a laser beam completely or partly onto a lateral outer surface 103 of the parent substrate 100 and wherein a tilt angle between a propagation direction of the laser beam and a horizontal plane is at least 20 degree, e.g., at least 30 degree.

Figure 11A:
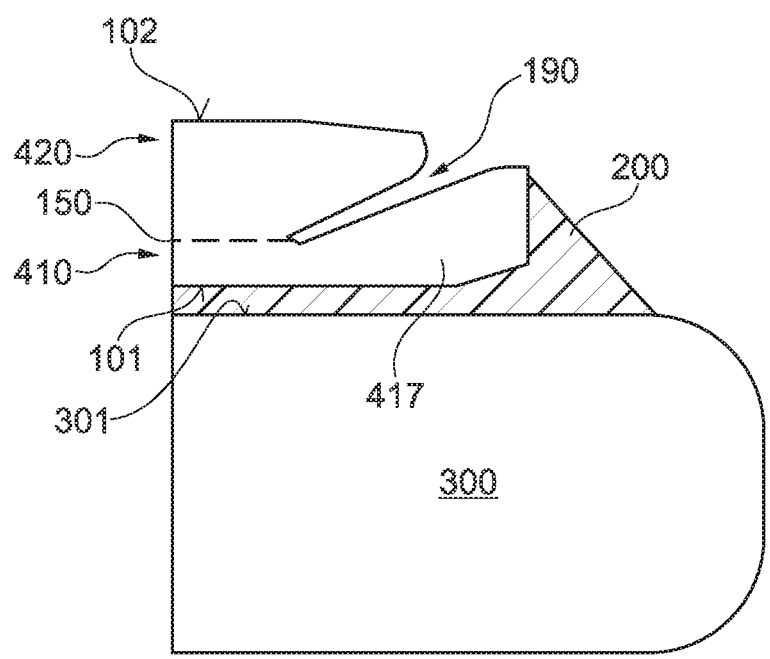
FIGS. 11A-11D are schematic vertical cross-sectional views of a wafer composite according to embodiments referring to back side machining.

In FIG. 11A the groove 190 extends from an outermost edge of the second main surface 102 into direction of the lateral end of the detachment layer 150.

Figure 11B:
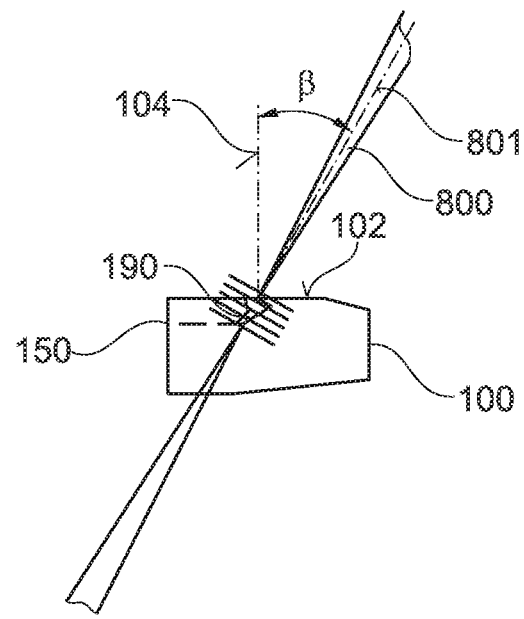

In FIG. 11B a tilt angle $ between the vertical direction 104 and a laser beam axis 801 of the laser beam 800 is about 30 degree. The impinging site is completely within the strictly horizontal main portion of the second main surface 102.

Figure 11C:
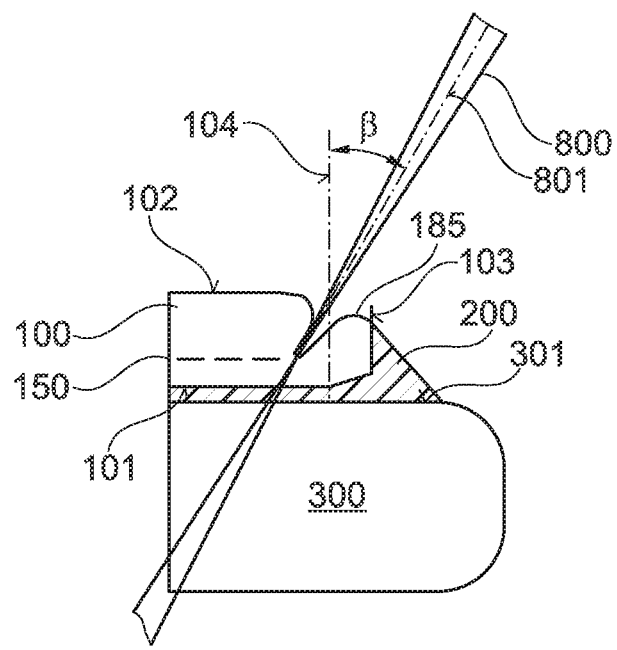

In FIG. 11C the tilt angle $\beta$ is about of 30 degree and the impinging site is predominantly within a slightly chamfered portion of the second main surface 102 and to some degree on the lateral outer surface 103.

Figure 11D:
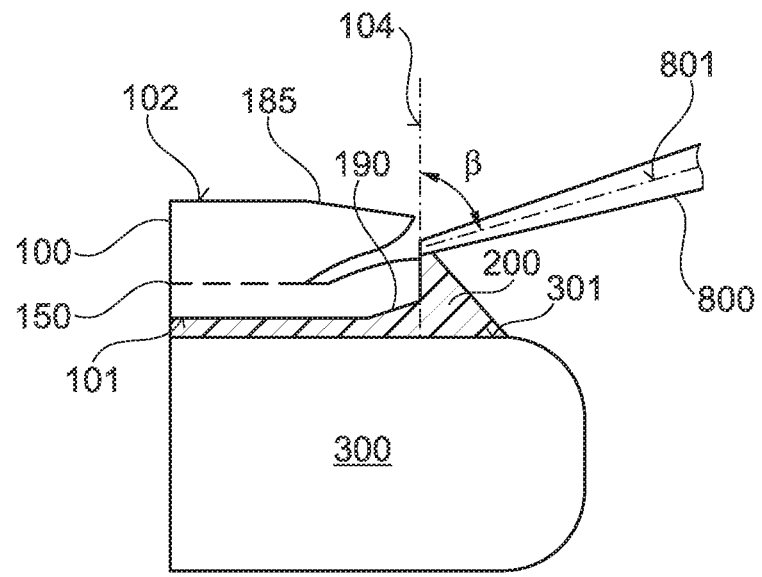

In FIG. 11D the tilt angle $\beta$ is about 75 degree. The impinging site is completely on the lateral outer surface 103.

In each of the examples illustrated in FIGS. 11A-11D, the groove 190 is formed at the back side of the parent substrate 100 after attaching the parent substrate 100 with the front side down to the auxiliary carrier 300. According to other examples (not illustrated) the grooves 190 are formed in the same way as illustrated but at the front side of the parent substrate 100 prior to attaching the parent substrate 100 with the front side down to the auxiliary carrier 300.

Figure 12:
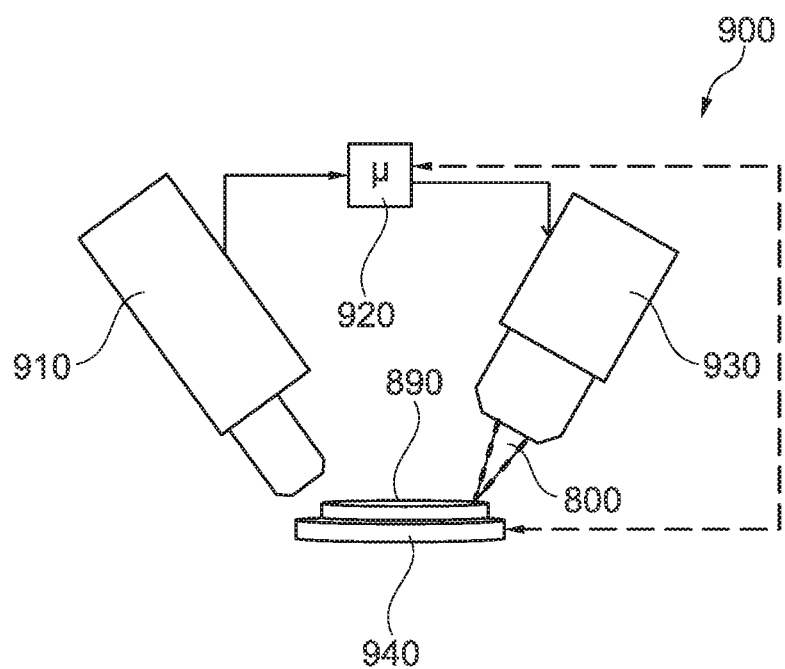
FIG. 12 is a schematic block diagram of a tool assembly suitable for performing front side and/or back side machining according to a further embodiment.

FIG. 12 schematically shows a machining apparatus 900 for tilted laser ablation along the circumference of crystalline parent substrates with arbitrary horizontal cross-section. A profile sensor unit 910 may obtain shape information about the shape of the parent substrate 100. A scan unit 920 may generate a laser beam 800 impinging on the parent substrate at an angle between 10 degree and 80 degree with respect to a vertical direction and may control the position of an impinging site of the laser beam 800 on the parent substrate. A wafer composite 890 including the parent substrate may be temporarily mounted on a stage unit 940. The stage unit 940 may allow rotational and/or linear movement of the wafer composite 890 relative to the profile sensor unit 910 and the scan unit 930.

A control unit 920 may process information obtained from the profile sensor unit 910 and, if applicable from the stage unit 940, and may control a relative movement between the scan unit 920 and the stage unit 940 in a way that the laser beam 800 follows a desired path on the surface of the wafer composite 890.

The machining apparatus 900 allows formation of any of the grooves as described above, in particular of grooves 190 as described with reference to FIGS. 4A-4E, 10, and 11A-11D.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a device substrate, the method comprising:
   providing a parent substrate that comprises a central region and an edge region, the edge region surrounding the central region;
   forming a detachment layer in the central region, the detachment layer extending parallel to a main surface of the parent substrate and comprising modified substrate material; and
   forming a groove in the edge region, the groove laterally enclosing the central region and running vertically and/or tilted to the detachment layer,
   wherein the groove laterally delimits the detachment layer such that the detachment layer terminates before reaching the edge region.

2. The method of claim 1, further comprising:
   splitting the parent substrate along a splitting surface through the detachment layer,
   wherein a portion of the parent substrate forms the device substrate.

3. The method of claim 1, wherein in the edge region, a distance between the main surface and a second main surface of the parent substrate opposite the main surface decreases with increasing distance to a lateral center of the parent substrate.

4. The method of claim 1, wherein the groove extends from a first main surface of the parent substrate into the parent substrate.

5. The method of claim 1, wherein the groove comprises an inner groove sidewall oriented to a lateral center of the parent substrate, wherein the inner groove sidewall comprises a vertical sidewall section, and wherein the detachment layer cuts the vertical sidewall section.

6. The method of claim 1, wherein the groove is spaced from a lateral outer surface of the parent substrate.

7. The method of claim 1, wherein the groove extends inwardly from a lateral outer surface.

8. The method of claim 1, wherein forming the groove comprises a laser-assisted material removal, wherein the laser-assisted material removal comprises directing a laser beam onto a first main surface of the parent substrate and/or onto a second main surface of the parent substrate, and wherein the second main surface is opposite the first main surface.

9. The method of claim 8, wherein the laser beam is tilted into a direction of a lateral center of the parent substrate, and wherein an angle between a vertical direction and the laser beam is at least 30 degree.

10. The method of claim 1, wherein forming the groove comprises a laser-assisted material removal, wherein the laser-assisted material removal comprises directing a laser beam completely or partly onto a lateral outer surface of the parent substrate, wherein the lateral outer surface connects the two main surfaces, and wherein an angle between a propagation direction of the laser beam and a horizontal plane is at least 30 degree.

11. The method of claim 10, wherein the laser beam is tilted into a direction of a lateral center of the parent substrate, and wherein an angle between a vertical direction and the laser beam is at least 30 degree.

12. The method of claim 1, further comprising:
   connecting an auxiliary carrier and the parent substrate,
   wherein the main surface of the parent substrate faces a working surface of the auxiliary carrier, and
   wherein the auxiliary carrier and the parent substrate are connected after forming the groove in the main surface or prior to forming the groove in a second main surface of the parent substrate opposite the main surface.

13. The method of claim 12, wherein connecting the auxiliary carrier and the parent substrate comprises forming an adhesive structure between the working surface of the auxiliary carrier and the central region of the parent substrate.

14. The method of claim 12, wherein connecting the auxiliary carrier and the parent substrate comprises:
   forming an adhesive layer between the working surface of the auxiliary carrier and the first main surface of the parent substrate; and
   releasing and/or removing, prior to splitting, a peripheral adhesive portion of the adhesive layer in the edge region.

15. A parent substrate, comprising:
   a central region and an edge region, the edge region surrounding the central region;
   a detachment layer in the central region, the detachment layer extending parallel to a main surface and comprising modified substrate material; and
   a groove in the edge region, the groove laterally enclosing the central region and running vertically and/or tilted to the detachment layer,
   wherein the groove laterally delimits the detachment layer such that the detachment layer terminates before reaching the edge region.

16. The parent substrate of claim 15, wherein in the edge region, a distance between main surfaces of the parent substrate decreases with increasing distance to a lateral center of the parent substrate.

17. The parent substrate of claim 15, wherein the groove comprises an inner groove sidewall, wherein the inner groove sidewall comprises a vertical sidewall section, and wherein the detachment layer cuts the vertical sidewall section.

18. A wafer composite, comprising:
   the parent substrate of claim 15; and
   an auxiliary carrier attached to the parent substrate,
   wherein a first main surface of the parent substrate is oriented to a working surface of the auxiliary carrier.

19. The wafer composite of claim 18, further comprising:
   an adhesive structure between the auxiliary carrier and the central region of the parent substrate,
   wherein the adhesive structure is absent between the auxiliary carrier and the edge region of the parent substrate.

20. A parent substrate, comprising:
   a central region and an edge region, the edge region surrounding the central region;
   a detachment layer in the central region, the detachment layer extending parallel to a main surface and comprising modified substrate material; and
   a groove in the edge region, the groove laterally enclosing the central region and running vertically and/or tilted to the detachment layer,
   wherein in the edge region, a distance between main surfaces of the parent substrate decreases with increasing distance to a lateral center of the parent substrate.

21. A parent substrate, comprising:
   a central region and an edge region, the edge region surrounding the central region;

a detachment layer in the central region, the detachment layer extending parallel to a main surface and comprising modified substrate material; and a groove in the edge region, the groove laterally enclosing the central region and running vertically and/or tilted to the detachment layer, wherein the groove comprises an inner groove sidewall, wherein the inner groove sidewall comprises a vertical sidewall section, and wherein the detachment layer cuts the vertical sidewall section.

22. The method of claim 1, wherein forming the detachment layer in the central region comprises penetrating a laser beam through a second main surface of the parent substrate opposite the main surface to form modified structures in the detachment layer.

23. The method of claim 22, wherein the modified structures comprise stripes of modified material separated by stripes of non-modified material.

24. The method of claim 23, further comprising generating microcracks in the detachment layer by mechanical stress induced by thermal heating through the laser beam and/or volume expansion through phase change of the substrate material, wherein the microcracks originate at the stripes of modified material.

25. The parent substrate of claim 15, wherein the modified substrate material comprises stripes of modified material separated by stripes of non-modified material.

26. The parent substrate of claim 25, wherein the detachment layer comprises microcracks that originate at the stripes of modified material.

* * * * *